(12) United States Patent
Zhou

(10) Patent No.: US 10,790,360 B2
(45) Date of Patent: Sep. 29, 2020

(54) SEMICONDUCTOR DEVICE AND MANUFACTURING METHOD THEREFOR

(71) Applicants: Semiconductor Manufacturing International (Beijing) Corporation, Beijing (CN); Semiconductor Manufacturing International (Shanghai) Corporation, Shanghai (CN)

(72) Inventor: Ming Zhou, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 0 days.

(21) Appl. No.: 16/391,908

(22) Filed: Apr. 23, 2019

(65) Prior Publication Data
US 2019/0252502 A1 Aug. 15, 2019

Related U.S. Application Data

(62) Division of application No. 15/683,029, filed on Aug. 22, 2017, now Pat. No. 10,312,329.

(30) Foreign Application Priority Data

Sep. 30, 2016 (CN) .......................... 2016 1 0871339

(51) Int. Cl.
*H01L 29/78* (2006.01)
*H01L 29/06* (2006.01)
(Continued)

(52) U.S. Cl.
CPC .... *H01L 29/1606* (2013.01); *H01L 21/02527* (2013.01); *H01L 21/76877* (2013.01);
(Continued)

(58) Field of Classification Search
None
See application file for complete search history.

(56) References Cited

U.S. PATENT DOCUMENTS 9,543,156 B1 * 1/2017 Hu .................... H01L 21/28247
2013/0175506 A1 7/2013 Heo et al.
(Continued)

OTHER PUBLICATIONS

European Search Report dated Feb. 7, 2018 in corresponding European Application No. 17188978.5.

*Primary Examiner* — Charles D Garber
*Assistant Examiner* — Xiaoming Liu
(74) *Attorney, Agent, or Firm* — Brinks Gilson & Lione

(57) ABSTRACT

The present disclosure relates to the technical field of semiconductor processes, and discloses a semiconductor device and a manufacturing method therefor. The manufacturing method includes: providing a substrate structure including a substrate and a first material layer on the substrate, wherein a recess is formed in the substrate and the first material layer includes a nanowire; forming a base layer on the substrate structure; selectively growing a graphene layer on the base layer; forming a second dielectric layer on the graphene layer; forming an electrode material layer on the substrate structure to cover the second dielectric layer; defining an active region; and forming a gate by etching at least a portion of a stack layer to at least the second dielectric layer so as to form a gate structure surrounding an intermediate portion of the nanowire, where the gate structure includes a portion of the electrode material layer and the second dielectric layer. The present disclosure incorporates (Continued)

graphene into the semiconductor process and makes use of the features of graphene in a dual-gate structure.

12 Claims, 29 Drawing Sheets

(51) Int. Cl.
*H01L 29/16* (2006.01)
*H01L 23/528* (2006.01)
*H01L 21/768* (2006.01)
*H01L 21/02* (2006.01)
*H01L 29/423* (2006.01)
*H01L 29/66* (2006.01)
*H01L 29/786* (2006.01)

(52) U.S. Cl.
CPC ........ *H01L 23/528* (2013.01); *H01L 29/0673* (2013.01); *H01L 29/42392* (2013.01); *H01L 29/66772* (2013.01); *H01L 29/78* (2013.01); *H01L 29/78684* (2013.01); *H01L 29/78696* (2013.01)

(56) References Cited

U.S. PATENT DOCUMENTS

| | | | |
|---|---|---|---|
| 2013/0194855 A1* | 8/2013 | Franca-Neto | H01L 27/2481 365/72 |
| 2014/0008606 A1 | 1/2014 | Hussain | |
| 2014/0217507 A1 | 8/2014 | Chang et al. | |
| 2015/0232343 A1 | 8/2015 | Liu | |
| 2016/0148936 A1* | 5/2016 | Xu | H01L 27/0924 257/369 |
| 2016/0204228 A1* | 7/2016 | Tapily | H01L 29/66742 438/151 |
| 2016/0336439 A1* | 11/2016 | Lee | H01L 29/78696 |
| 2017/0200738 A1 | 7/2017 | Kim | |

* cited by examiner

U.S. 10,790,360 B2

SEMICONDUCTOR DEVICE AND MANUFACTURING METHOD THEREFOR

CROSS REFERENCE TO RELATED APPLICATIONS

This application is a divisional of U.S. application Ser. No. 15/683,029 (still pending), filed on Aug. 22, 2017 which claims priority to Chinese Patent Application No. 201610871339.8, filed Sep. 30, 2016, the entire contents of each of which is incorporated herein by reference.

BACKGROUND

Technical Field

The present disclosure relates to the field of semiconductors, particularly to a semiconductor device and a manufacturing method therefor, and more particularly to a graphene semiconductor device and a manufacturing method therefor.

Related Art

With the constant development of semiconductor technologies, the size of semiconductor devices becomes smaller. The size of semiconductor devices based on silicon materials has evolved according to the Moore's Law for about 40 years. The Complementary Metal Oxide Semiconductor (CMOS for short) technology can almost be considered as the cornerstone of the development of the global information technologies. Semiconductor devices based on silicon materials will still be the mainstream of the development of semiconductor technologies at least for an indefinitely long period of time in the future. However, to ensure that the semiconductor technologies can continue to evolve according to the Moore's Law, only reducing the device size proportionally cannot sufficiently meet the requirements. Therefore, new materials need to be introduced into the existing CMOS manufacturing process, so as to further lower the production and manufacturing costs, improve the device performance, and reduce power consumption due to leakage current. Graphene-based electronic devices are considered to be one of the candidate solutions for semiconductor devices.

SUMMARY

To address at least one of the foregoing problems, the present disclosure proposes the at least the following forms of implementations.

According to an aspect of the present disclosure, a method for manufacturing a semiconductor device is provided. The method includes: providing a substrate structure, including a substrate and a first material layer on the substrate, wherein a recess is formed in the substrate and the first material layer includes a nanowire spanning and suspended above the recess; forming a base layer on the substrate structure, where the base layer includes at least a first portion covering an exposed surface of the nanowire and a second portion covering an exposed surface of the recess; selectively growing a graphene layer on the base layer; forming a second dielectric layer on the graphene layer; forming an electrode material layer on the substrate structure to cover the second dielectric layer; partially removing the electrode material layer, the second dielectric layer, and the graphene layer so as to define an area of an active region wherein at least a portion of a stack layer of the electrode material layer, the second dielectric layer, and the graphene layer on the nanowire remains and is within the active region; and forming a gate by etching at least a portion of the remaining stack layer within the active region to at least the second dielectric layer so as to form a gate structure surrounding an intermediate portion of the nanowire, where the gate structure includes a portion of the electrode material layer and the second dielectric layer.

In a form, after defining the gate, the method further includes: removing portions of the graphene layer and the second dielectric layer on a surface of the recess.

In a form, defining the active region includes: forming a patterned mask on the electrode material layer, the patterned mask shielding at least a portion of the nanowire; and removing, by using the patterned mask, portions of the electrode material layer, the second dielectric layer, and the graphene layer not shielded by the patterned mask.

In a form, the patterned mask shields the nanowire and at least a portion of the recess.

In a form, the substrate includes a substrate layer and a first dielectric layer on the substrate layer, wherein the first material layer is on the first dielectric layer; the recess is formed in the first dielectric layer; and providing a substrate structure includes: providing an initial substrate structure including the substrate and the first material layer on the first dielectric layer; patterning the first material layer to define a region covering the nanowire and two sides of the nanowire along the length direction of the nanowire; and removing at least upper portions of the first dielectric layer of the defined region to form the recess.

In a form, the recess further extends through the first dielectric layer into the substrate layer.

In a form, the graphene layer includes a first portion on a surface of the first portion of the base layer, and a second portion on a surface of the second portion of the base layer; the second dielectric layer includes a first portion on a surface of the first portion of the graphene layer, and a second portion on a surface of the second portion of the graphene layer; and wherein the electrode material layer is further formed to fill a space below the nanowire and between the first portion of the second dielectric layer and the second portion of the second dielectric layer when forming the electrode material layer.

In a form, the first material layer further includes a portion above the first dielectric layer at two ends of the recess bonded to the portion of the first material layer forming the nanowire; and the patterned mask shields the nanowire, and further shields at least a portion of the first material layer that is bonded to the nanowire.

In a form, the first material layer comprises polysilicon, doped polysilicon, or silicon germanium; the base layer comprises an oxide of aluminum; the first dielectric layer comprises an oxide of silicon; and the second dielectric layer comprises boron nitride, an oxide of silicon, an oxide of hafnium, an oxide of aluminum, or a nitride of aluminum.

In a form, the material of the base layer includes an oxide of aluminum, and selectively growing the graphene layer on the base layer includes selectively growing the graphene layer at a temperature of 900-1000° C. by a chemical vapor deposition process using methane and hydrogen.

In a form, the nanowire comprises doped polysilicon; and the portion of the electrode material layer in the gate structure is used as a first gate, and the nanowire is used as a second gate.

In a form, forming the gate includes: forming a third dielectric layer to cover at least the substrate structure and the area of the active region; and etching, by using a patterned mask defining a gate area, a portion of the third dielectric layer outside the gate area and at least a portion of the stack layer within the active region but outside the gate area to at least the second dielectric layer so as to form a gate structure surrounding an intermediate portion of the nanowire, where the gate structure includes a portion of the electrode material layer and the second dielectric layer.

In a form, the method further includes: forming a fourth dielectric layer to at least cover the substrate structure and the area of the active region; forming a hole through the fourth dielectric layer and the second dielectric layer to the graphene layer, the hole being separated from the gate structure; and filling the hole with a conductive material, so as to form a contact component to the graphene layer.

In a form, after the gate defining processing, the method further includes: forming a fourth dielectric layer to at least cover the substrate structure and the area of the active region; forming a hole through the fourth dielectric layer, the second dielectric layer, and the graphene layer to the first material layer; forming an insulating material layer on a side wall of the hole; and after the insulating material layer is formed, filling the hole with a conductive material so as to form a contact component to the first material layer.

In a form, the method further includes: forming a fourth dielectric layer to at least cover the substrate structure and the area of the active region; forming a hole through the fourth dielectric layer, the second dielectric layer, and the graphene layer to the at least a portion of the first material layer; forming an insulating material layer on a side wall of the hole; and after the insulating material layer is formed, filling the hole with a conductive material so as to form a contact component to the at least a portion of the first material layer, where the insulating material layer electrically isolates the graphene layer from the contact component.

According to another aspect of the present disclosure, a semiconductor device is provided. The semiconductor device includes: a substrate structure including a substrate and a first material layer on the substrate, and a recess formed in the substrate, wherein the first material layer comprises a nanowire spanning and suspended above the recess; a base layer on an exposed surface of the nanowire; a graphene layer on the base layer; a second dielectric layer on the graphene layer; and a gate structure surrounding an intermediate portion of the nanowire, where the gate structure includes a portion of the electrode material layer and the second dielectric layer surrounding the portion of the second dielectric layer.

In a form, the substrate includes a substrate layer and a first dielectric layer on the substrate layer, wherein the first material layer is on the first dielectric layer, and the recess is formed in the first dielectric layer.

In a form, the recess further extends through the first dielectric layer into the substrate layer.

In a form, the gate structure further includes a portion in the recess below the nanowire.

In a form, the first material layer further includes a portion above the first dielectric layer at two ends of the recess bonded to the portion of the first material layer forming the nanowire.

In a form, the first material layer comprises polysilicon, doped polysilicon, or silicon germanium; the base layer comprises an oxide of aluminum; the first dielectric layer comprises an oxide of silicon; and the second dielectric layer comprises boron nitride, an oxide of silicon, an oxide of hafnium, an oxide of aluminum, or a nitride of aluminum.

In a form, the graphene layer is selectively grown on the base layer.

In a form, the nanowire comprises doped polysilicon; and the portion of the electrode material layer in the gate structure is used as a first gate, and the nanowire is used as a second gate.

In a form, the device further includes: a second base layer on an exposed surface of the recess; a second graphene layer on the second base layer; and a second dielectric layer on the second graphene layer, where the base layer is integrally formed with the second base layer, the graphene layer is integrally formed with the second graphene layer, and the second dielectric layer is integrally formed with the second dielectric layer.

In a form, the device further includes: a fourth dielectric layer, covering at least the substrate structure and the nanowire on which a stack layer of the base layer, the graphene layer, and the second dielectric layer is formed; a hole through the fourth dielectric layer and the second dielectric layer to the graphene layer; and a contact component filling the hole and to the graphene layer.

In a form, the device further includes: a fourth dielectric layer, covering at least the substrate structure and the nanowire on which a stack layer of the base layer, the graphene layer, and the second dielectric layer is formed; a hole through the fourth dielectric layer, the second dielectric layer, and the graphene layer to the first material layer; an insulating material layer on a side wall of the hole; and a contact component filling the hole and to the first material layer, where the insulating material layer electrically isolates the graphene layer from the contact component.

In a form, the device further includes: a fourth dielectric layer, covering at least the substrate structure and the nanowire on which a stack layer of the base layer, the graphene layer, and the second dielectric layer is formed; a hole through the fourth dielectric layer, the second dielectric layer, and the graphene layer to the portion of the first material layer; and a contact component which is formed to the at least a portion of the first material layer by filling the hole with a conductive material.

According to the following detailed descriptions of the forms of implementations for illustration purposes of the present disclosure with reference to the accompanying drawings, other characters and advantages of the present disclosure will become clear.

BRIEF DESCRIPTION OF THE DRAWINGS

The accompanying drawings that form a part of the specification describe forms of the present disclosure, and are used to explain the principles of the present disclosure together with the specification.

With reference to the accompanying drawings, the present disclosure can be understood more clearly according to the following detailed description, where.

DETAILED DESCRIPTION

Figure 1:
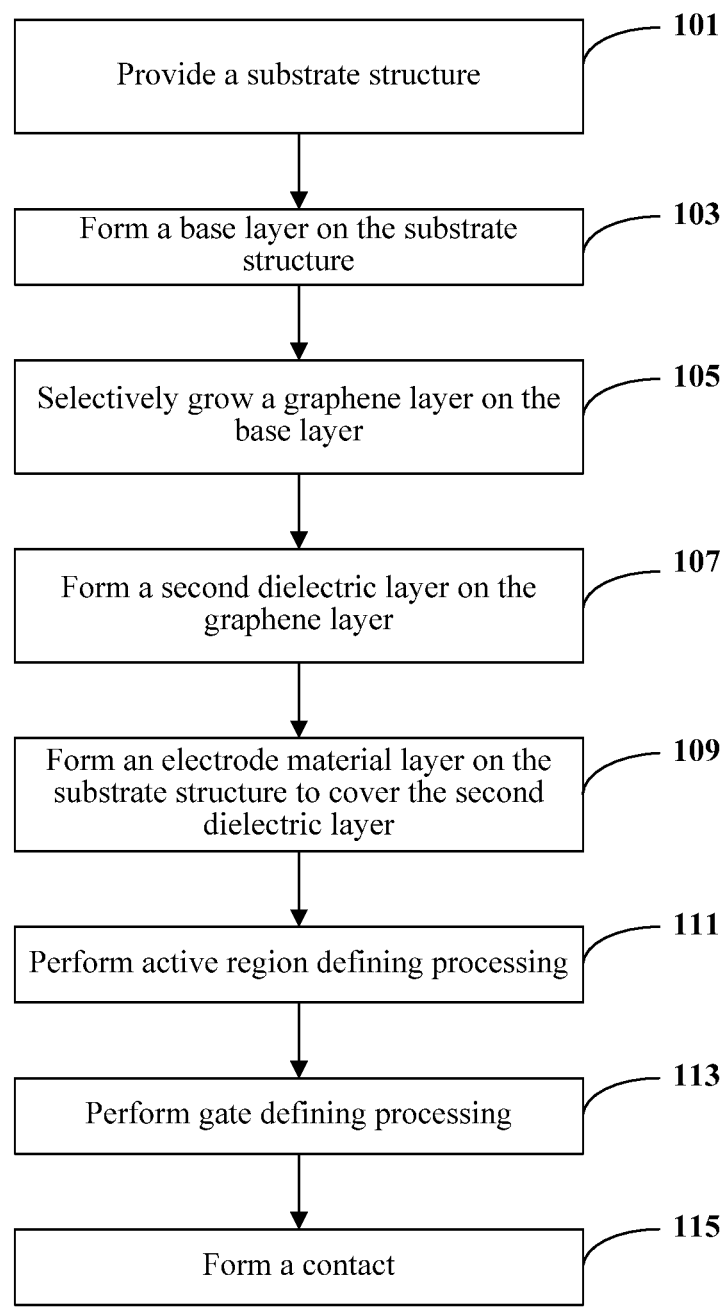
FIG. 1 is a schematic flowchart of a method for manufacturing a semiconductor device.

Various exemplary forms or implementations for illustration purposes of the present disclosure are described in details with reference to the accompanying drawings. It should be noted that unless being described in detail, relative layouts, mathematical expressions, and numeric values of components and steps described in these forms do not limit the scope of the present disclosure.

Meanwhile, it should be noted that for convenience of description, sizes of the parts shown in the accompanying drawings may not be drawn according to an actual proportional relationship.

The following description about at least one exemplary form is illustrative only, and would not be used as any limitation on the present disclosure and applications or uses of the present disclosure.

Technologies, methods, and devices that are known by a person of ordinary skill in the related art may not be discussed in detail. However, if appropriate, these technologies, methods, and devices should be considered as a part of the description.

In all examples shown and discussed herein, any specific value should be interpreted to be illustrative only rather than a limitation. Therefore, other examples of the forms may have different values.

It should be noted that the term "semiconductor device", used in a general sense and when there is no other specific limitations, includes any device operating partly or entirely based on semiconductor principles, including but not limited to: various semiconductor elements such as a diode, a bipolar transistor, and a field effect transistor; an integrated or discrete circuit, die, or chip composed of various semiconductor elements; and any device of the foregoing element, circuit, die, or chip. However, it should be further noted that the scope of this term may be specifically limited: in different exemplary forms, the term "semiconductor device" may be limited, by other definitions which are relevant to this term, by explicitly description in the context, or by requirement of operating principles, to particular semiconductor elements, circuits, dies, chips, or devices only.

It should be noted that similar reference numerals, labels, and letters represent similar items in the following accompanying drawings. Therefore, once an item is defined in a figure, the item needs not to be further discussed in subsequent figures.

FIG. 1 is a schematic flowchart of a method for manufacturing a semiconductor device. FIG. 2A to FIG. 16B are schematic diagrams that illustrate a plurality of phases of a manufacturing process of a semiconductor device. Description is made in the following with reference to FIG. 1 and FIG. 2A to FIG. 16B.

As shown in FIG. 1, in step 101, a substrate structure is provided.

Figure 2A:
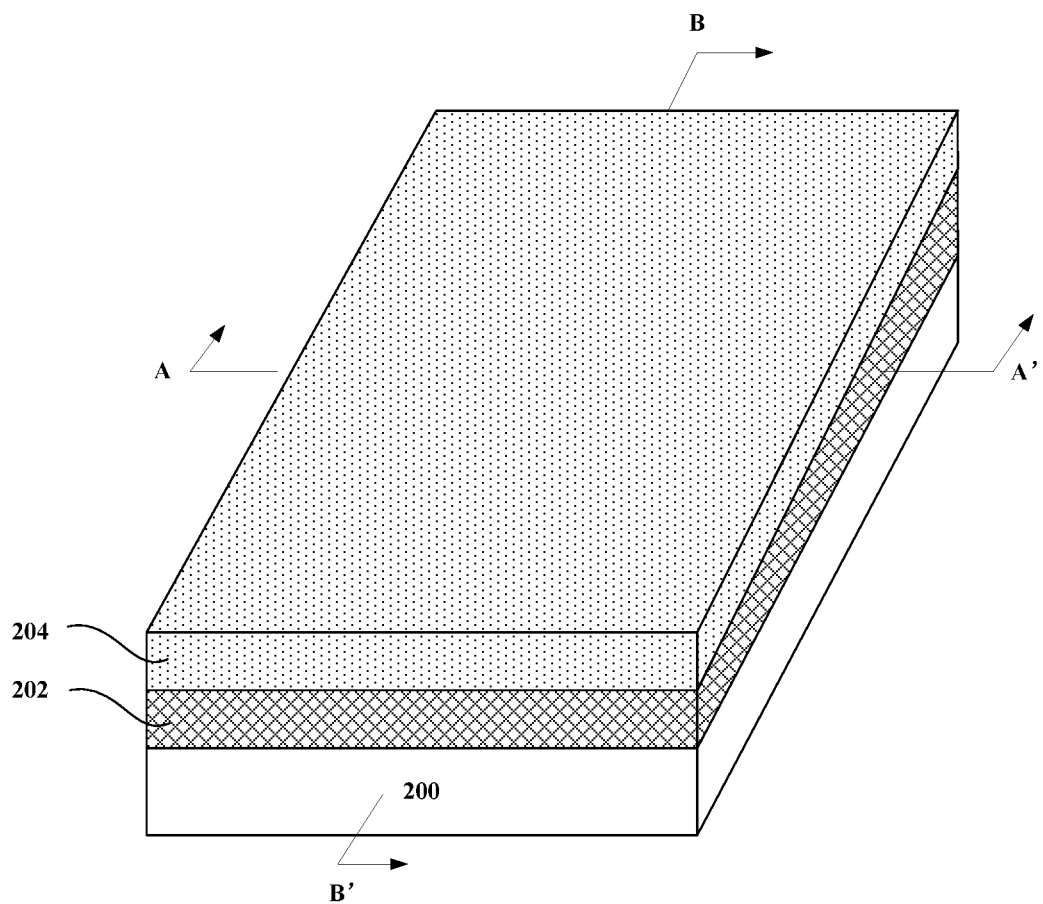
FIG. 2A is a perspective view of a structure at a phase of a manufacturing process of a semiconductor device.
Figure 2B:
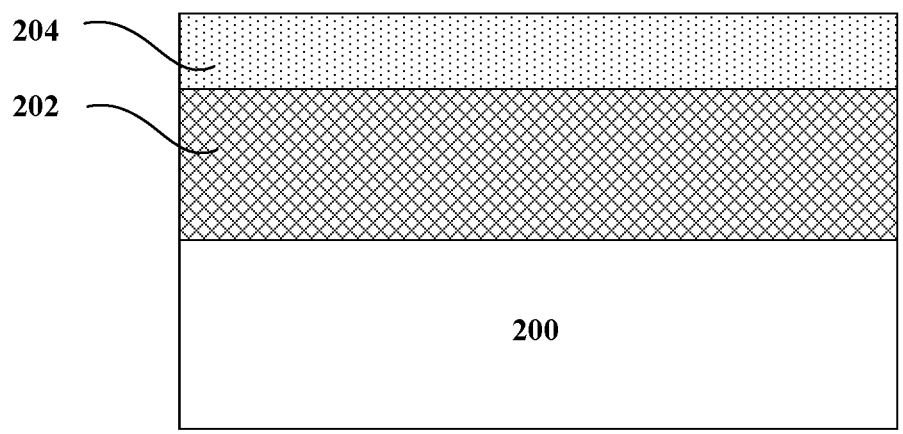
FIG. 2B schematically illustrates a cross-sectional diagram intercepted along a line A-A' in FIG. 2A.
Figure 2C:
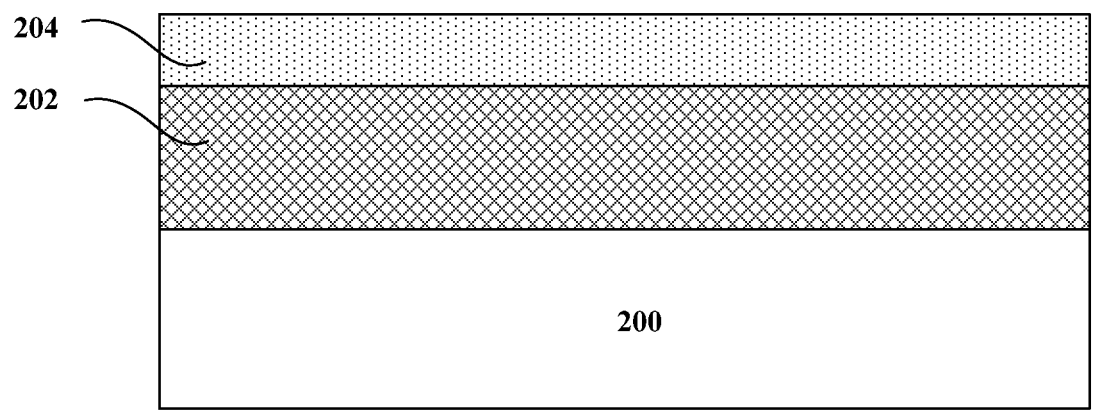
FIG. 2C schematically illustrates a cross-sectional diagram intercepted along a line B-B' in FIG. 2A.

FIG. 2A is a perspective view of a structure in step 101 of a manufacturing process of a semiconductor device. FIG. 2B is a cross-sectional diagram that schematically illustrates a structure shown in FIG. 2A that is intercepted along a line A-A'. FIG. 2C is a cross-sectional diagram that schematically illustrates a structure shown in FIG. 2A that is intercepted along a line B-B'. Herein, it should be noted that in the accompanying drawings, an arrow related to the section line A-A' or B-B' represents a view direction.

As shown in FIG. 2A, FIG. 2B, and FIG. 2C, an initial substrate is provided, where the initial substrate structure may include a substrate and a first material layer 204 on the substrate.

In an implementation, the substrate may include a substrate layer 200 and a first dielectric layer 202 on the substrate layer 200. In such a situation, the first material layer 204 may be above the first dielectric layer 202. The material of the substrate layer 200 may include a semiconductor material such as silicon. A material forming the first dielectric layer 202 may include an oxide of silicon.

Figure 3A:
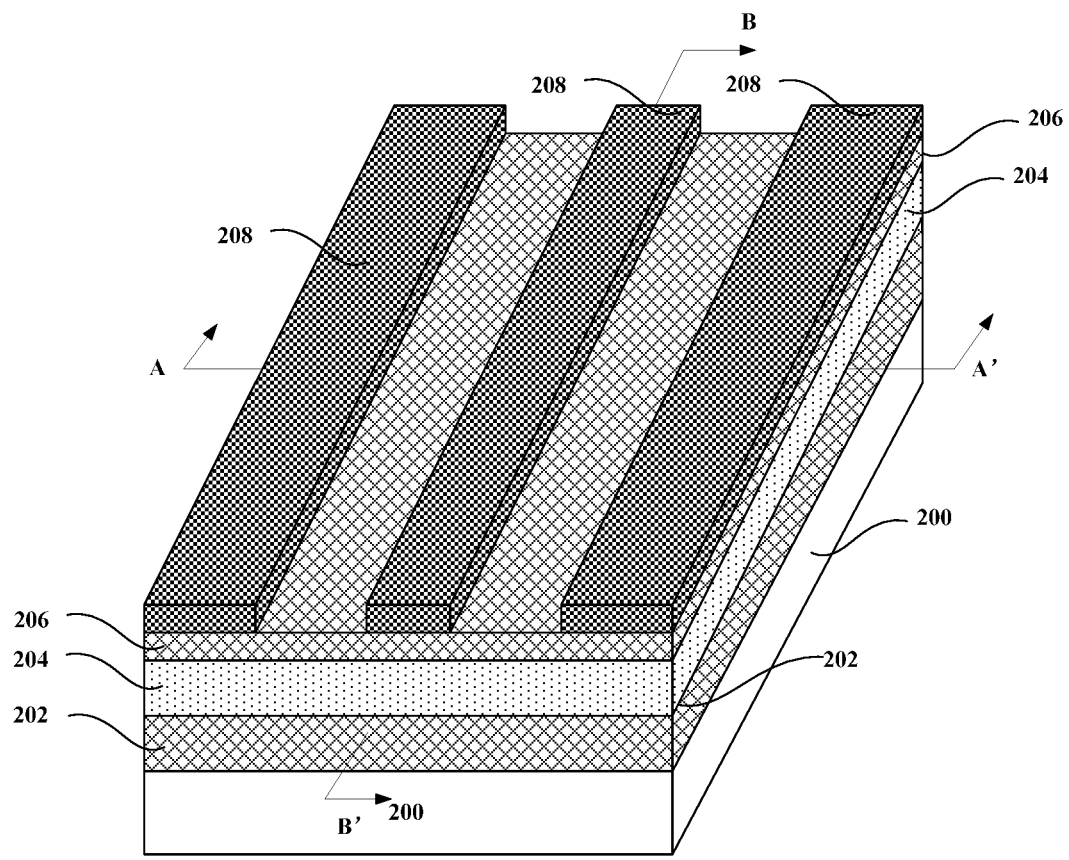
FIG. 3A is a perspective view of a structure at a phase of a manufacturing process of a semiconductor device.
Figure 3B:
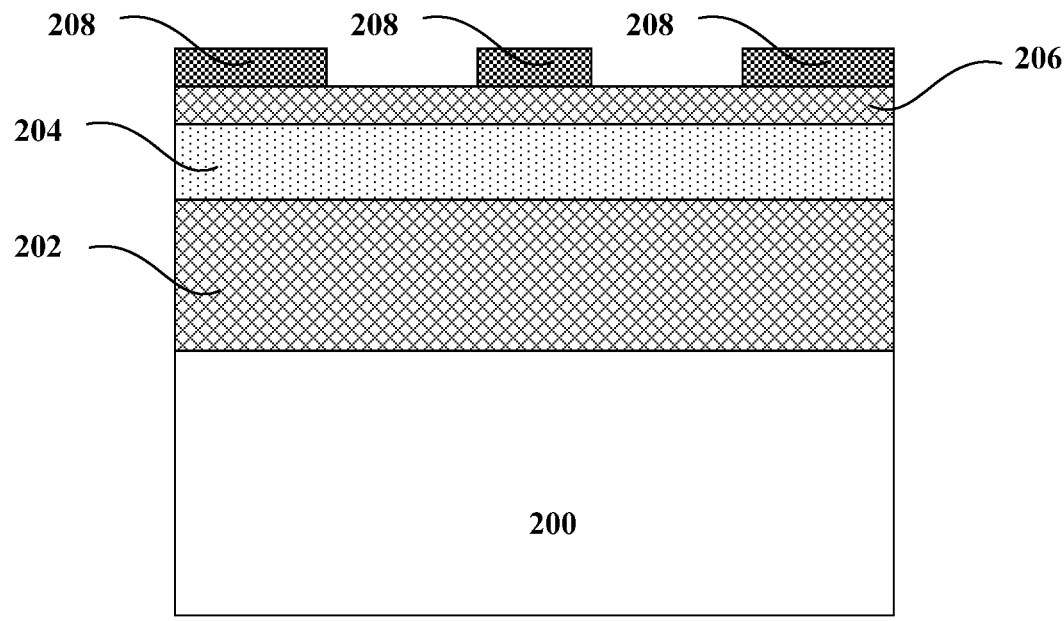
FIG. 3B schematically illustrates a cross-sectional diagram intercepted along a line A-A' in FIG. 3A.
Figure 3C:
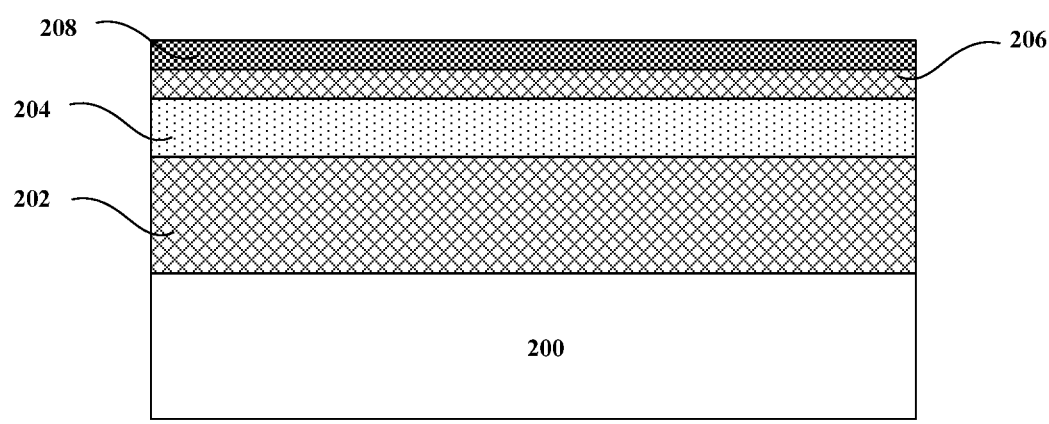
FIG. 3C schematically illustrates a cross-sectional diagram intercepted along a line B-B' in FIG. 3A.
Figure 4A:
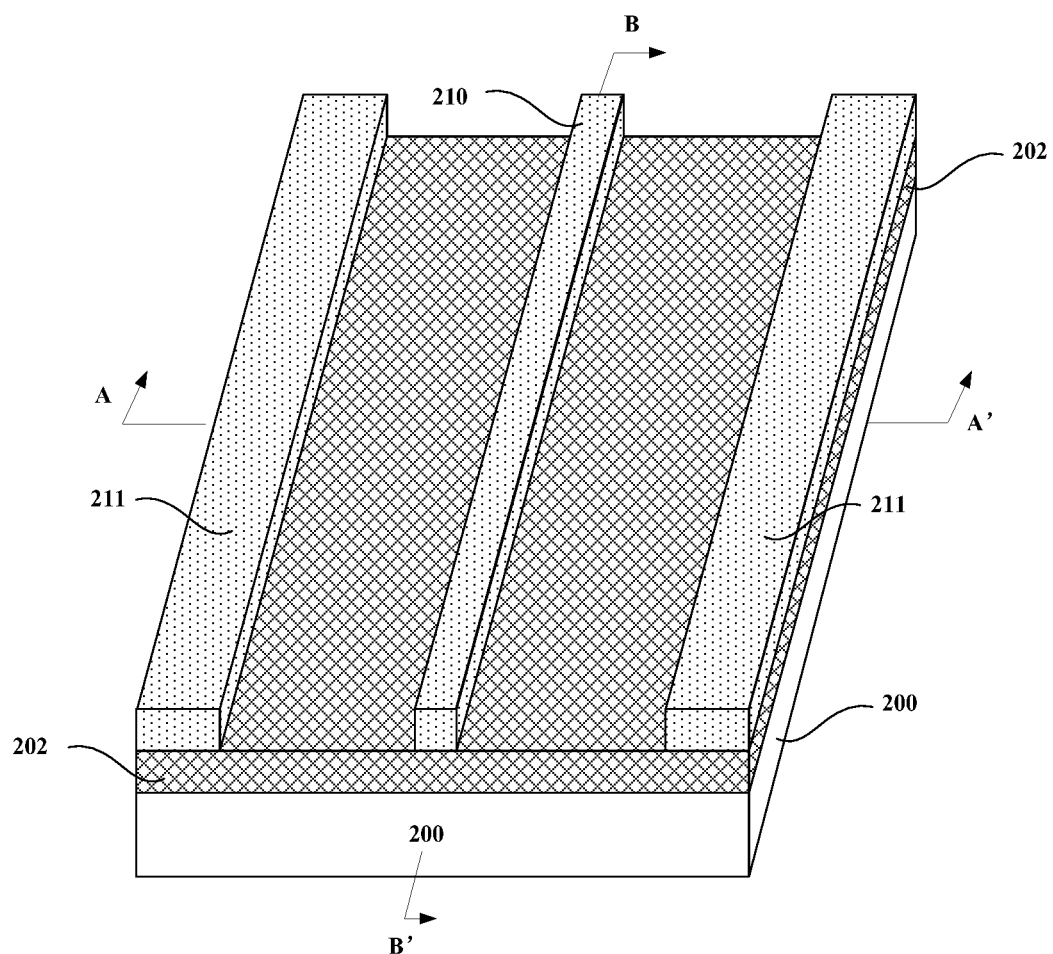
FIG. 4A is a perspective view of a structure at a phase of a manufacturing process of a semiconductor device.
Figure 4B:
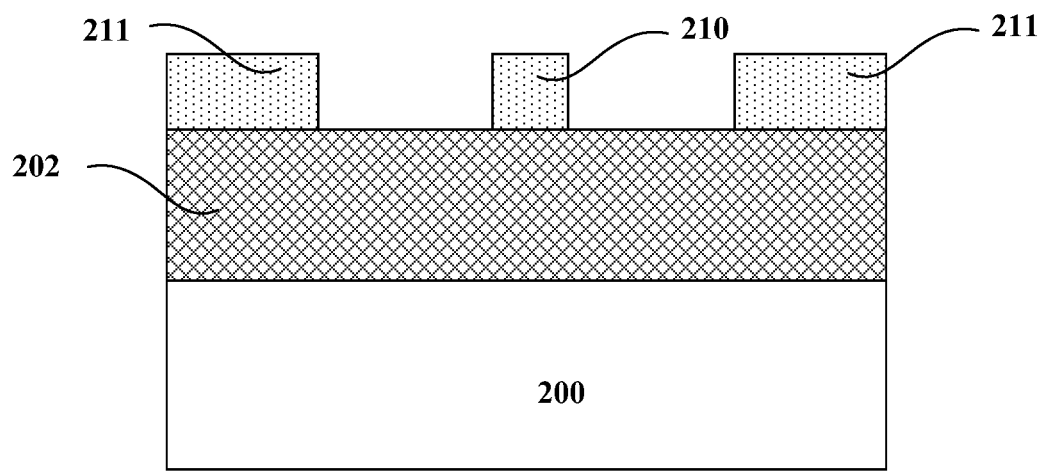
FIG. 4B schematically illustrates a cross-sectional diagram intercepted along a line A-A' in FIG. 4A.
Figure 4C:
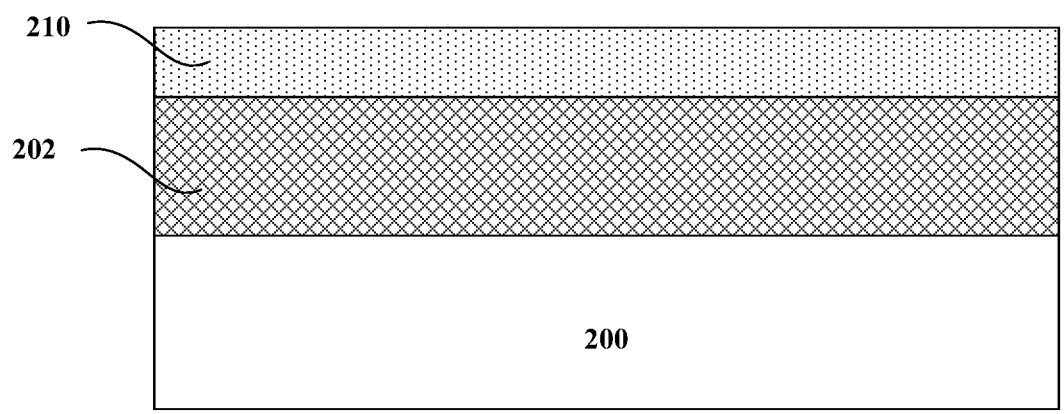
FIG. 4C schematically illustrates a cross-sectional diagram intercepted along a line B-B' in FIG. 4A.

Subsequently, the first material layer is patterned to form a nanowire. FIG. 3A and FIG. 4A are perspective view that schematically illustrate a process of forming an nanowire according to a form of this application; FIG. 3B schematically illustrates a cross-sectional diagram intercepted along a line A-A' in FIG. 3A; FIG. 3C schematically illustrates a cross-sectional diagram intercepted along a line B-B' in FIG. 3A; FIG. 4B schematically illustrates a cross-sectional diagram intercepted along a line A-A' in FIG. 4A; and FIG. 4C schematically illustrates a cross-sectional diagram intercepted along a line B-B' in FIG. 4A. As shown in FIG. 3A, FIG. 3B, and FIG. 3C, a first protection layer 206 and a patterned mask 208 may be successively formed on the first material layer 204. The material of the first protection layer 206 may include, for example, an oxide of silicon or a nitride of silicon. The first material layer 204 may be formed by materials such as polysilicon, or doped polysilicon or silicon germanium. The patterned mask may be formed by using a double patterning (double patterning) process, a self-assembly process, or a sidewall mask process. Subsequently, the first protection layer 206 and the first material layer 204 are etched by using a patterned first mask 208, so as to pattern the first material layer 204 to form a nanowire 210 (see FIG. 4A to FIG. 4C). Then the patterned mask 208 and the first protection layer 206 may be removed. The obtained device structure is shown in FIG. 4A-4C.

It should be noted that in FIG. 4A and FIG. 4B, a portion 211 obtained by patterning the first material layer 204 and is at two sides of the nanowire 210 is further shown. As shown in FIG. 4A and FIG. 4B, the portion 211 does not serve as a nanowire, but in other forms, the portion 211 may be formed as a nanowire.

Figure 5A:
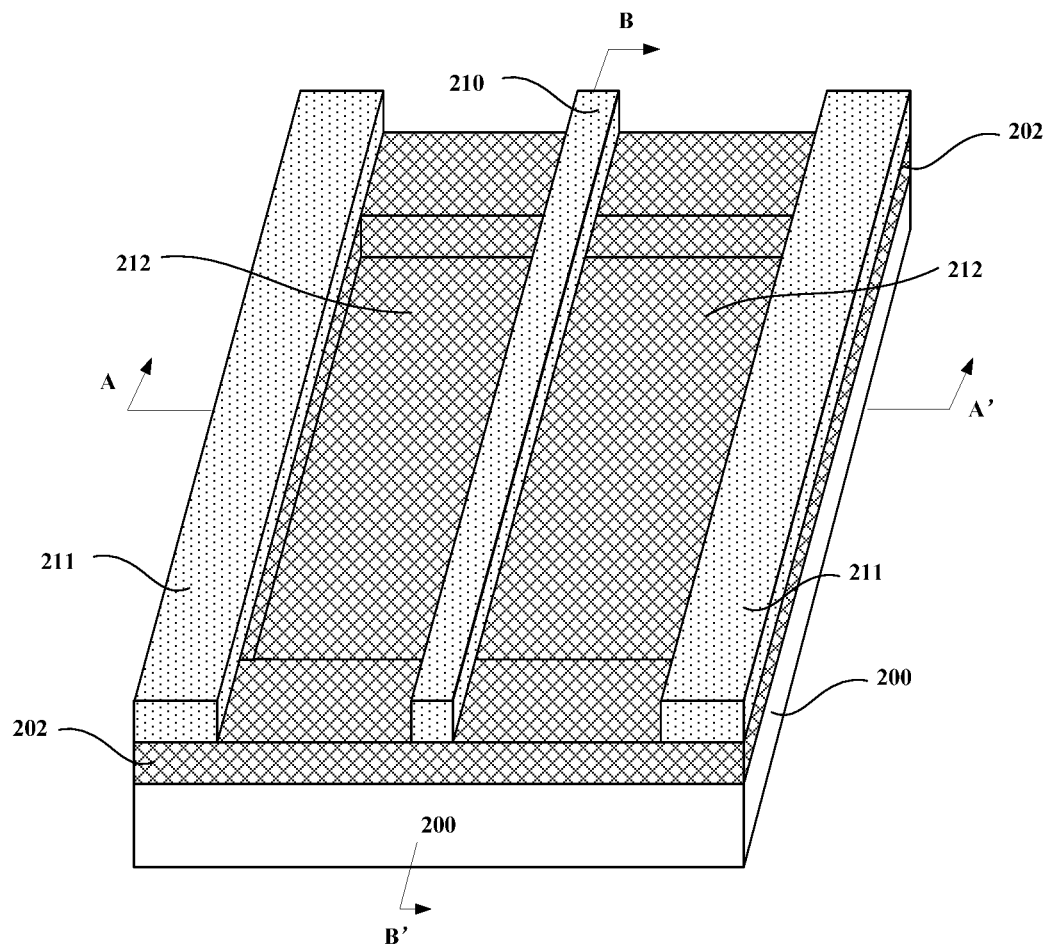
FIG. 5A is a perspective view of a structure at a phase of a manufacturing process of a semiconductor device.
Figure 5B:
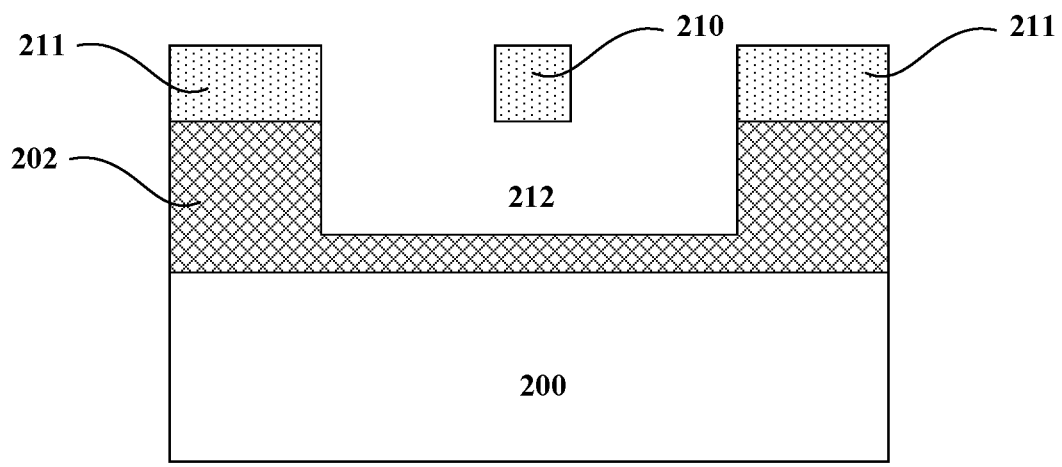
FIG. 5B schematically illustrates a cross-sectional diagram intercepted along a line A-A' in FIG. 5A.
Figure 5C:
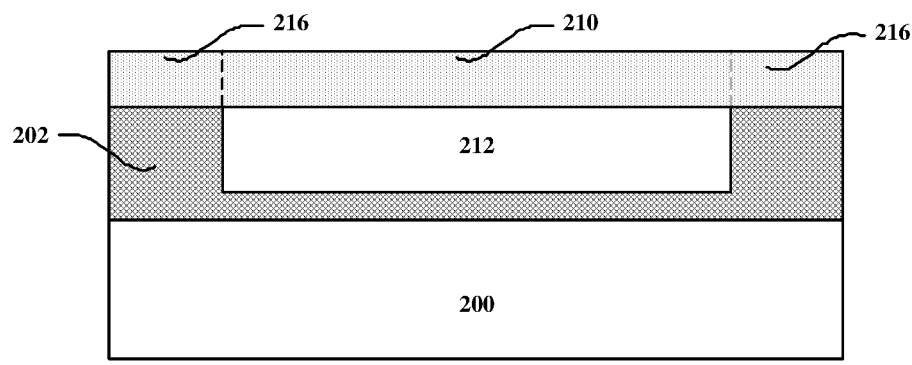
FIG. 5C schematically illustrates a cross-sectional diagram intercepted along a line B-B' in FIG. 5A.

Subsequently, a first removing processing is performed to remove at least upper portions of the first dielectric layer 202 which are below the nanowire 210 and within regions at two sides along a length direction of the nanowire 210, so as to form a recess 212, as shown in FIG. 5A. In a specific form, portions of the first dielectric layer 202 which are located at two sides of the nanowire 210 may be first etched by using dry etching to be below the nanowire 210. Then wet etching is performed, and a portion of the first dielectric layer 202 that is below the nanowire 210 is removed, so as to form the recess 212. FIG. 5A is a perspective view that schematically illustrates a structure in which the recess 212 is formed in this way. FIG. 5B schematically illustrates a cross-sectional diagram intercepted along a line A-A' in FIG. 5A. FIG. 5C schematically illustrates a cross-sectional diagram intercepted along a line B-B' in FIG. 5A.

In addition, as shown in FIG. 5A, FIG. 5B, and FIG. 5C, along a length direction of the nanowire 210, the nanowire 210 may include a portion above the recess 212, and a support portion 216 above edges of two ends of the recess 212 (the first dielectric layer 202). It can be seen from FIG. 5C that the first material layer 204 includes the nanowire 210, and the nanowire 210 spans the recess 212 and is suspended above the recess 212. Therefore, in some forms, the term "nanowire" indicates, in combination with other appropriate definitions when necessary, a portion of the nanowire which spans the recess and is suspended above the recess. In the accompanying drawings, e.g., FIG. 5C, the portion of the nanowire which spans the recess and is suspended above the recess is marked by a reference numeral 210.

In a specific form, the support portion 216 at two ends of the nanowire 210 may also extend along a width direction of the nanowire 210, i.e., the support portion 216 forms an "I" shape or an "H" shape (not shown in the figures) with the nanowire 210, where the nanowire 210 is a transverse connecting portion in the "H" shape. That is, the first material layer 204 may further include a portion 216 at two ends of the recess 212 and above the first dielectric layer 202. Two ends of the nanowire 210 may be bonded or connected to the portion 216 of the first material 204 that is at the two ends of the recess 212 and above the first dielectric layer 202. In this implementation, in step 111 described in the following, a patterned mask shields the nanowire 210, and further shields at least a portion of the first material layer 204 that is bonded or connected to the nanowire 210.

In addition, in FIG. 5A to FIG. 5C, the recess 212 is shown as being formed in the first dielectric layer 202. However, in another specific form, the recess 212 may further extend through the first dielectric layer 202 into the substrate layer 200.

Subsequently, as shown in FIG. 1, in step 103, a base layer is formed on the substrate structure.

Figure 6A:
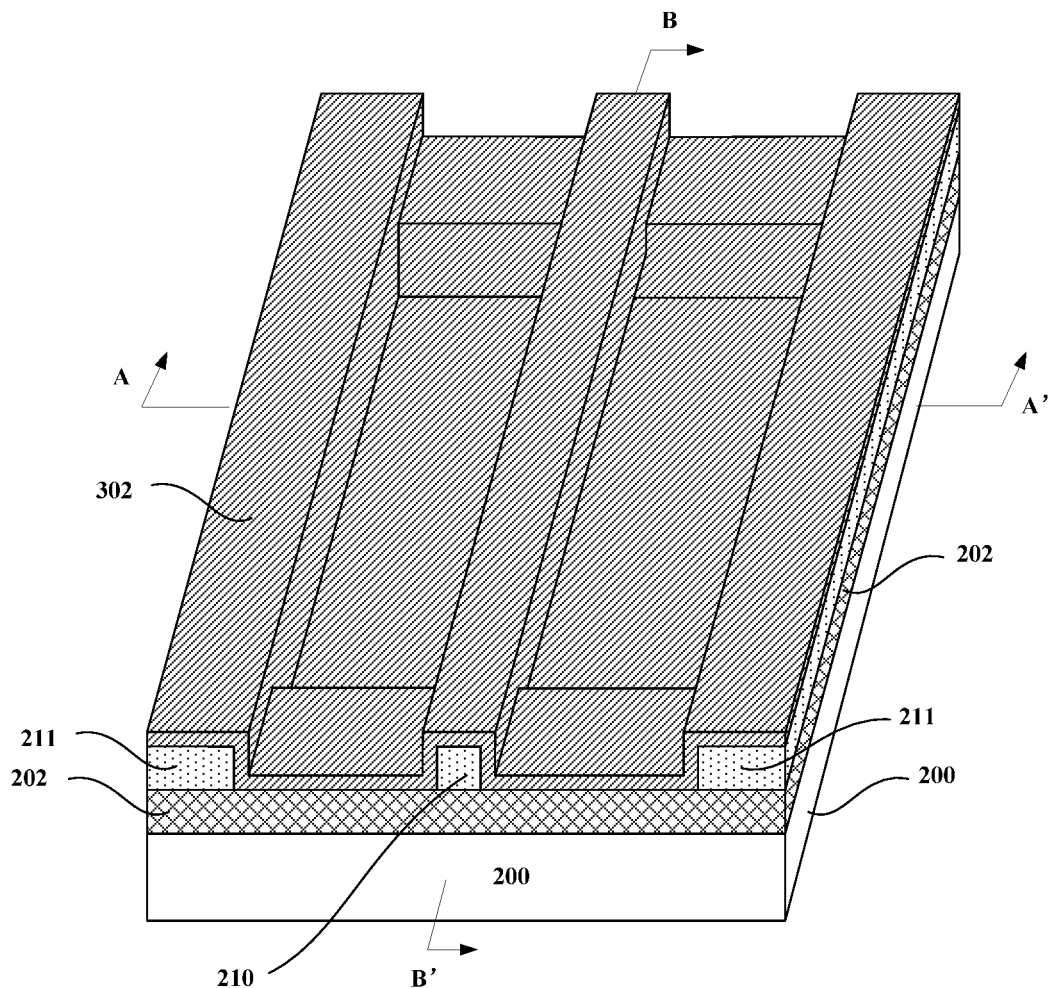
FIG. 6A is a perspective view of a structure at a phase of a manufacturing process of a semiconductor device.
Figure 6B:
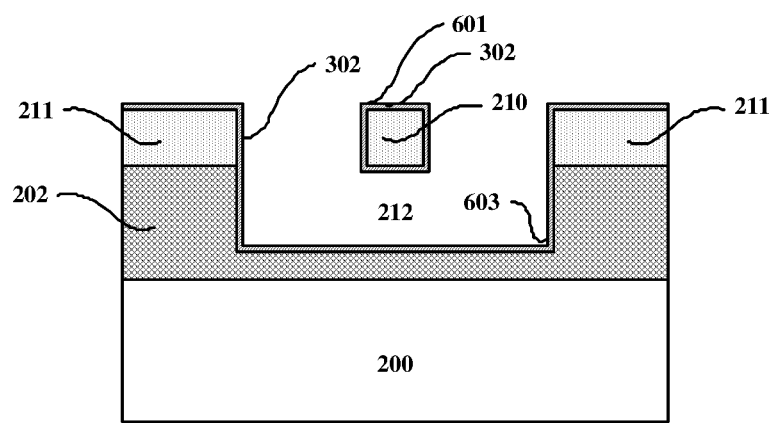
FIG. 6B schematically illustrates a cross-sectional diagram intercepted along a line A-A' in FIG. 6A.
Figure 6C:
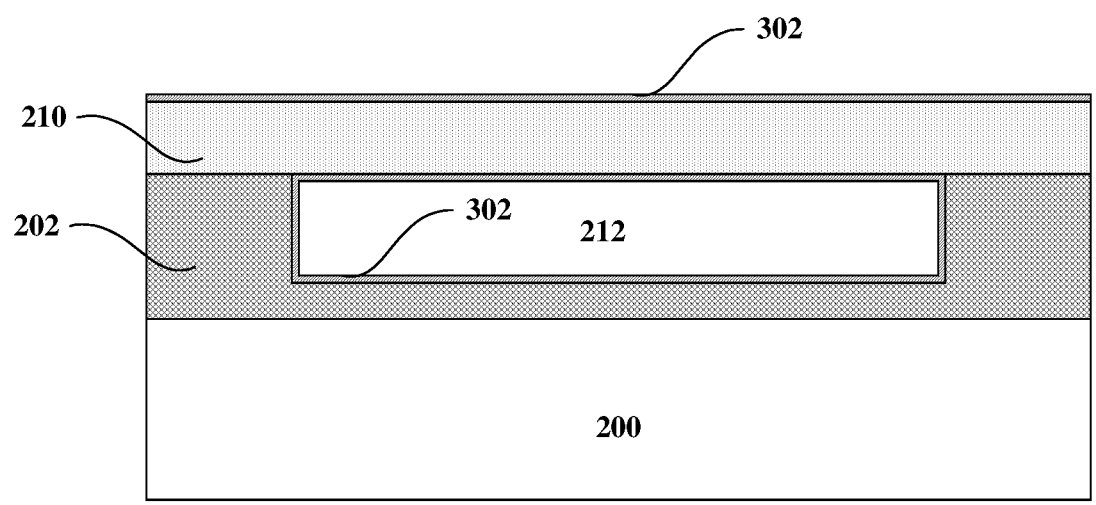
FIG. 6C schematically illustrates a cross-sectional diagram intercepted along a line B-B' in FIG. 6A.

FIG. 6A schematically illustrates a perspective view of a structure of a semiconductor device in step 103. FIG. 6B schematically illustrates a cross-sectional diagram of a structure shown in FIG. 6A that is intercepted along a line A-A'. FIG. 6C schematically illustrates a cross-sectional diagram of a structure shown in FIG. 6A that is intercepted along a line B-B'. As shown in FIG. 6A, FIG. 6B, and FIG. 6C, a base layer 302 is formed on the substrate structure. The base layer 302 includes at least a first portion 601 covering an exposed surface of the nanowire 210 and a second portion 603 covering an exposed surface of the recess 212. The material of the base layer 302 may include an oxide of aluminum, and may alternatively include another material, known by a person skilled in the art, on which graphene can be selectively grown. The base layer 302 may be formed by using an atomic layer deposition process.

Subsequently, as shown in FIG. 1, in step 105, a graphene layer is selectively grown on the base layer.

Figure 7A:
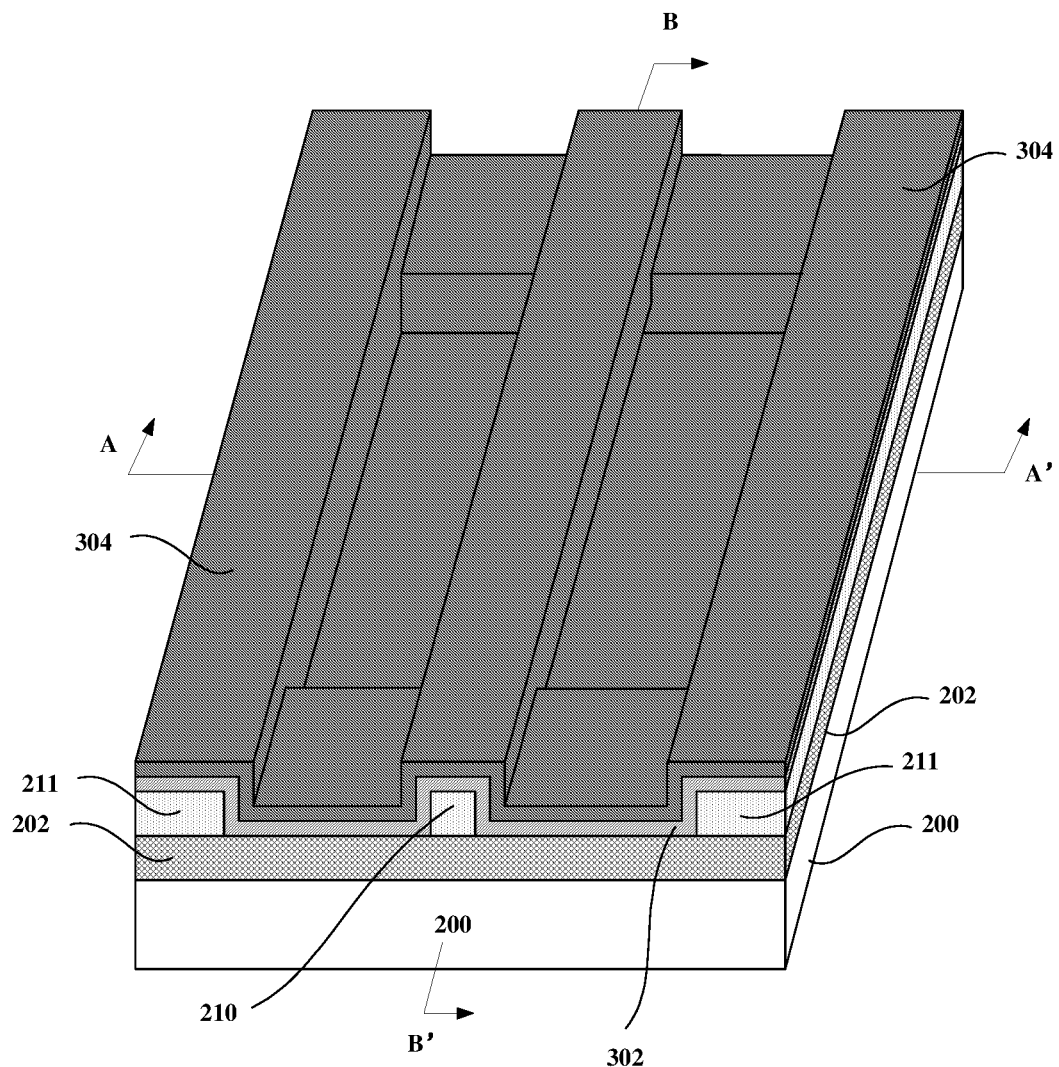
FIG. 7A is a perspective view of a structure at a phase of a manufacturing process of a semiconductor device.
Figure 7B:
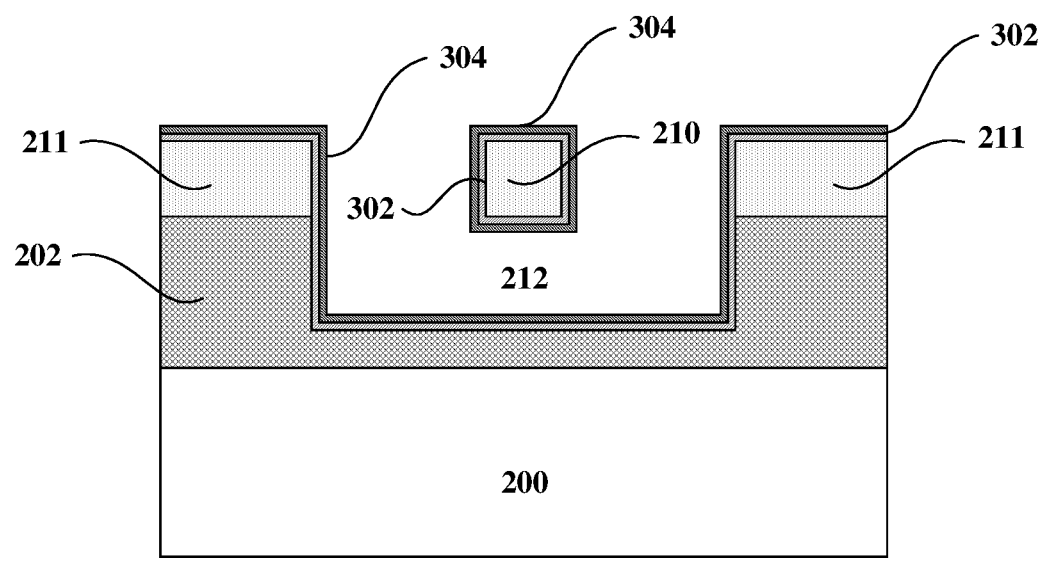
FIG. 7B schematically illustrates a cross-sectional diagram intercepted along a line A-A' in FIG. 7A.
Figure 7C:
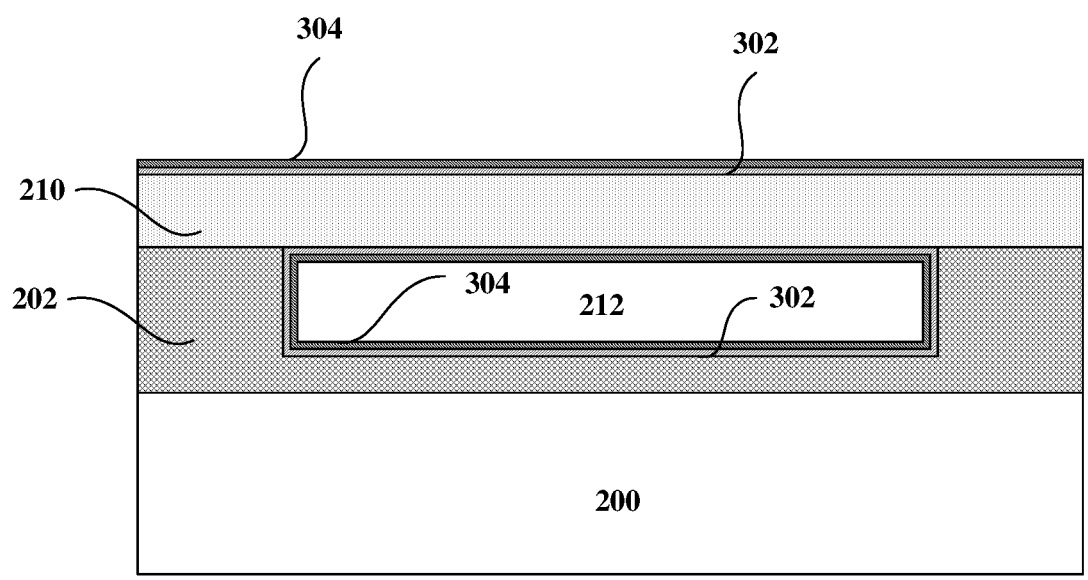
FIG. 7C schematically illustrates a cross-sectional diagram intercepted along a line B-B' in FIG. 7A.

FIG. 7A schematically illustrates a perspective view of a structure of a semiconductor device in step 105. FIG. 7B schematically illustrates a cross-sectional diagram of a structure shown in FIG. 7A that is intercepted along a line A-A'. FIG. 7C schematically illustrates a cross-sectional diagram of a structure shown in FIG. 7A that is intercepted along a line B-B'. As shown in FIG. 7A, FIG. 7B, and FIG. 7C, a graphene layer 304 is selectively grown on the base layer 302. Correspondingly, the graphene layer 304 may cover an exposed surface of the base layer 302, and include a first portion on a surface of the first portion of the base layer 302, and a second portion on a surface of the second portion of the base layer 302.

In a specific form, the step of selectively growing the graphene layer 304 on the base layer 302 includes selectively growing the graphene layer 304 at a temperature of 900-1000° C. by a chemical vapor deposition process using methane and hydrogen. It should be understood that the present disclosure is not limited thereto, but may also use other technologies for growing a graphene layer.

Subsequently, as shown in FIG. 1, in step 107, a second dielectric layer is formed on the graphene layer.

Figure 8A:
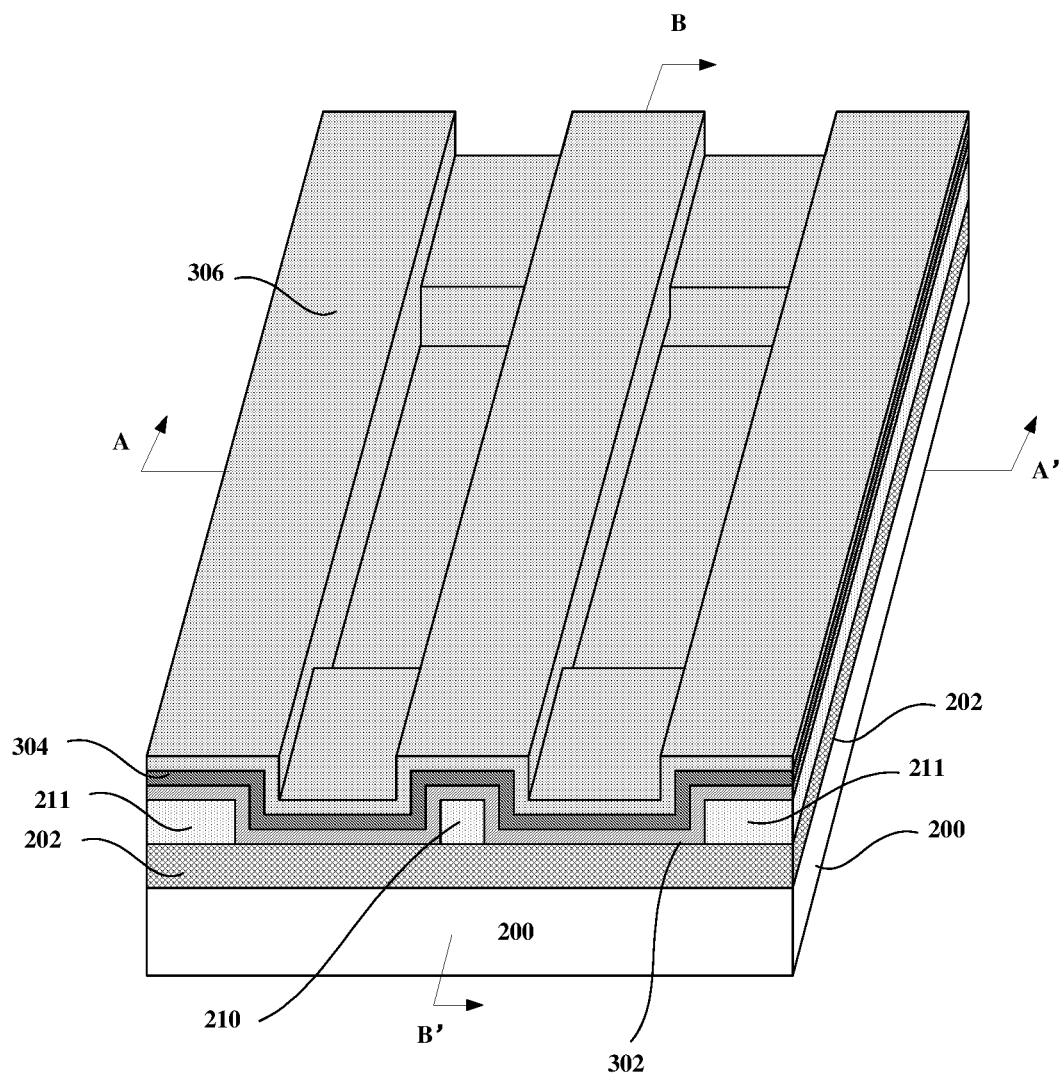
FIG. 8A is a perspective view of a structure at a phase of a manufacturing process of a semiconductor device.
Figure 8B:
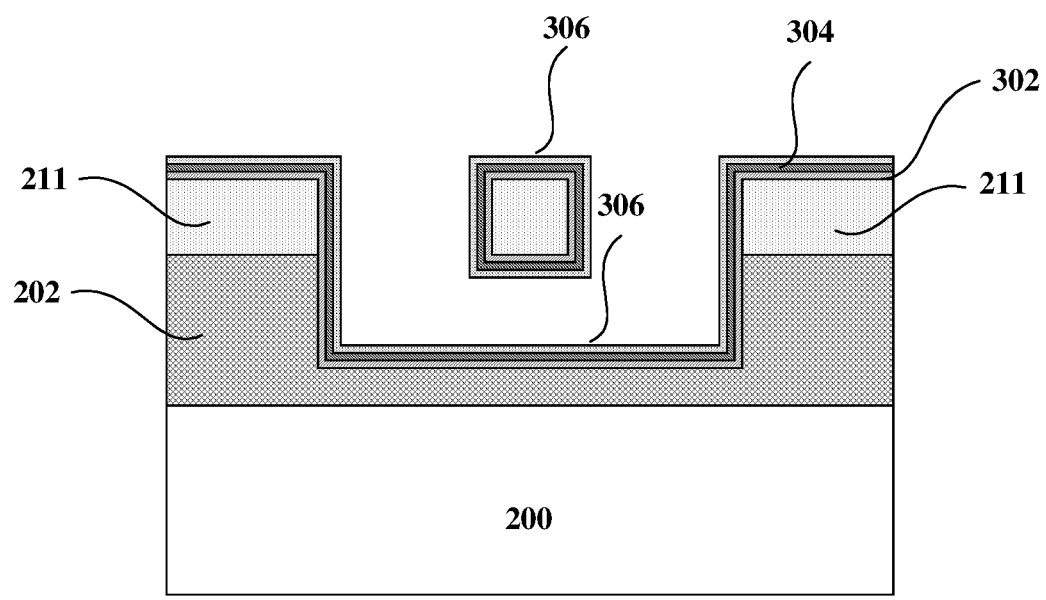
FIG. 8B schematically illustrates a cross-sectional diagram intercepted along a line A-A' in FIG. 8A.
Figure 8C:
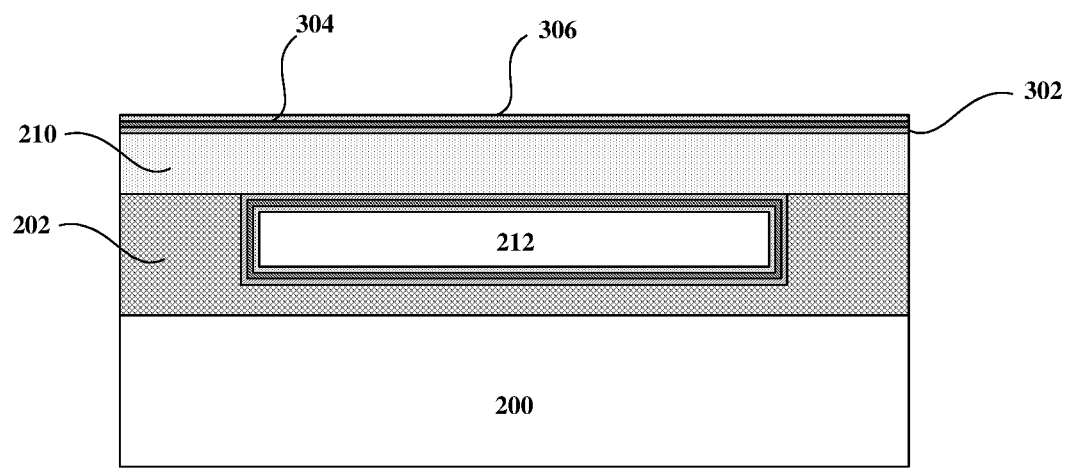
FIG. 8C schematically illustrates a cross-sectional diagram intercepted along a line B-B' in FIG. 8A.

FIG. 8A schematically illustrates a perspective view of a structure of a semiconductor device in step 107. FIG. 8B schematically illustrates a cross-sectional diagram of a structure shown in FIG. 8A that is intercepted along a line A-A'. FIG. 8C schematically illustrates a cross-sectional diagram of a structure shown in FIG. 8A that is intercepted along a line B-B'. As shown in FIG. 8A, FIG. 8B, and FIG. 8C, a second dielectric layer 306 is formed on the graphene layer 304. The second dielectric layer 306 may cover an exposed surface of the graphene layer 304. Correspondingly, the second dielectric layer 306 may include a first portion on a surface of the first portion of the graphene layer 304, and a second portion on a surface of the second portion of the graphene layer 304. The material of the second dielectric layer 306 may include boron nitride, an oxide of silicon, an oxide of hafnium, an oxide of aluminum, or a nitride of aluminum. The second dielectric layer 306 may be formed by using an atomic layer deposition process.

Subsequently, as shown in FIG. 1, in step 109, after the second dielectric layer is formed, an electrode material layer is formed on the substrate structure to cover the second dielectric layer.

Figure 9A:
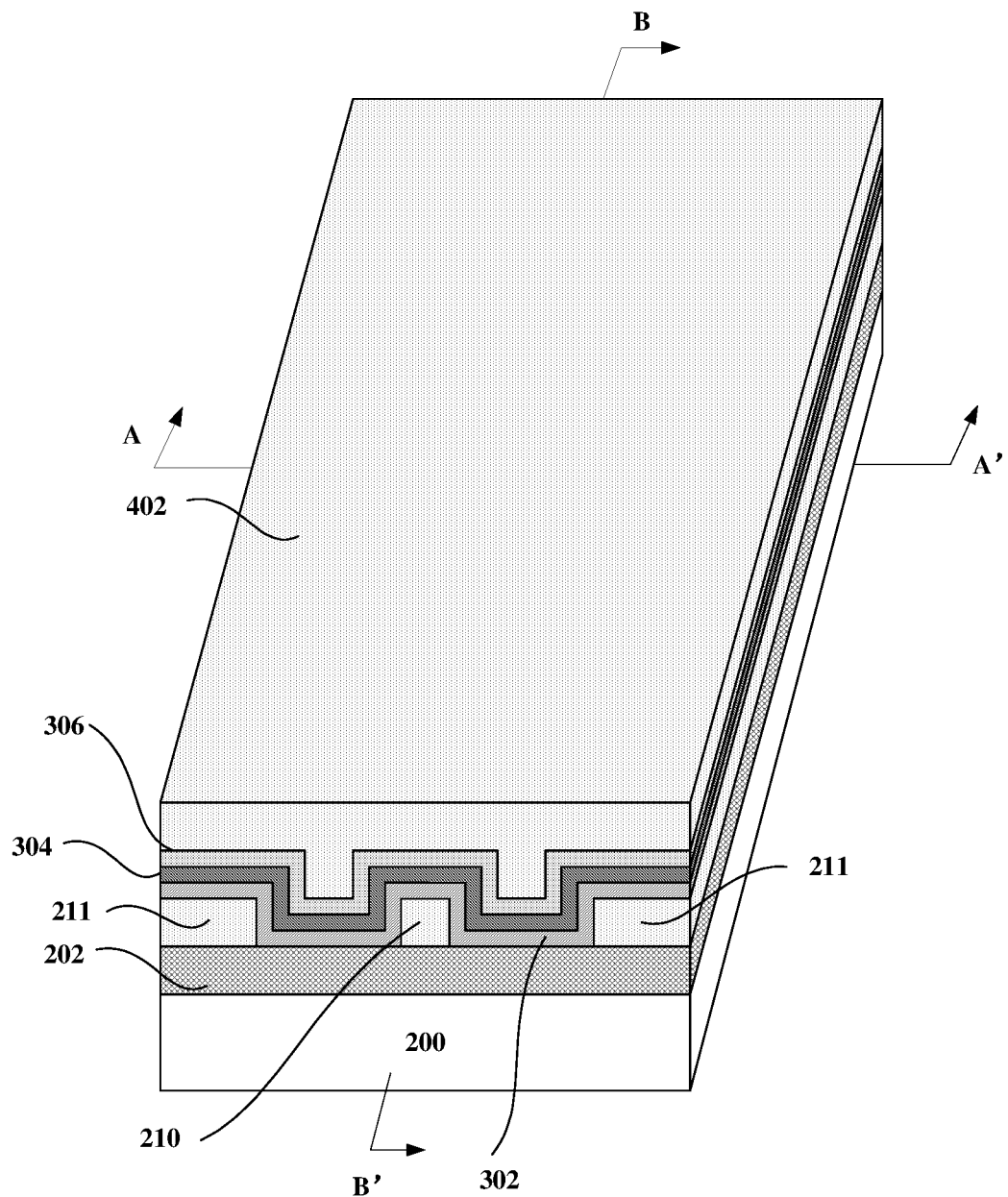
FIG. 9A is a perspective view of a structure at a phase of a manufacturing process of a semiconductor device.
Figure 9B:
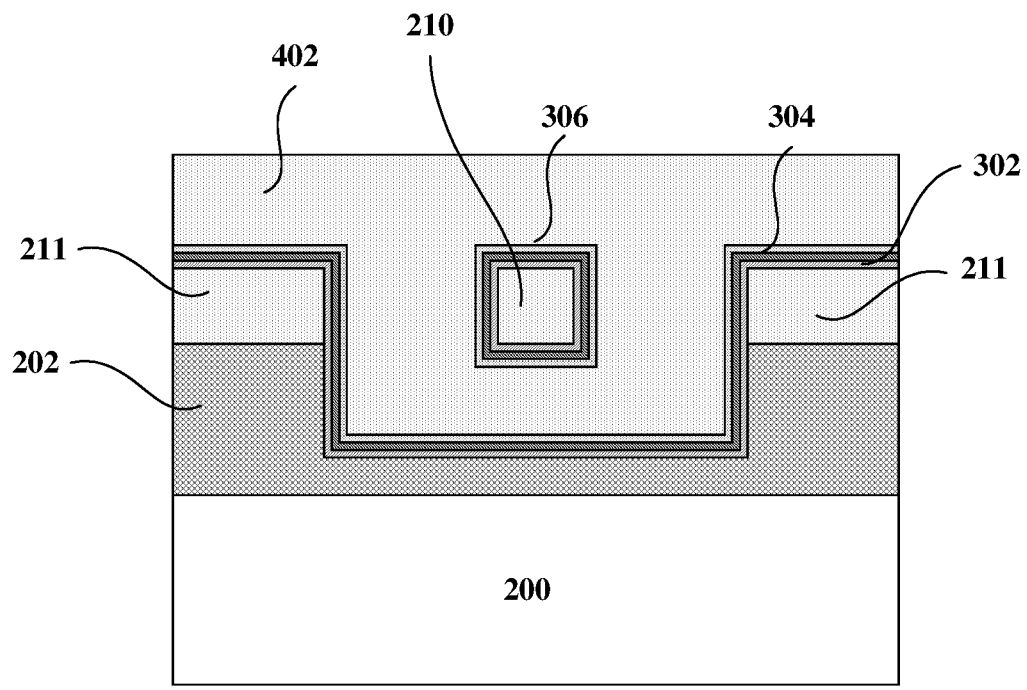
FIG. 9B schematically illustrates a cross-sectional diagram intercepted along a line A-A' in FIG. 9A.
Figure 9C:
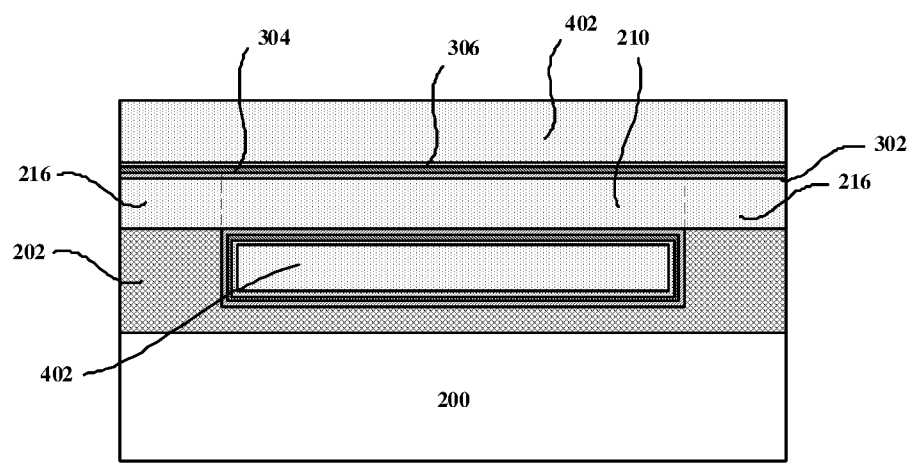
FIG. 9C schematically illustrates a cross-sectional diagram intercepted along a line B-B' in FIG. 9A.

FIG. 9A schematically illustrates a perspective view of a structure of a semiconductor device in step 109. FIG. 9B schematically illustrates a cross-sectional diagram of a structure shown in FIG. 9A that is intercepted along a line A-A'. FIG. 9C schematically illustrates a cross-sectional diagram of a structure shown in FIG. 9A that is intercepted along a line B-B'. In an implementation, as shown in FIG. 9A, FIG. 9B, and FIG. 9C, after the second dielectric layer 306 is formed, an electrode material layer 402 is formed on the substrate structure to cover the second dielectric layer 306. The electrode material layer 402 is further formed to fill a space below the nanowire 210 and between the first portion of the second dielectric layer 306 and the second portion of the second dielectric layer 306 (i.e., the electrode material layer 402 fills the recess 212). The material of the electrode material layer 402 may include polysilicon.

Subsequently, as shown in FIG. 1, in step 111, an active region defining processing is performed. The electrode material layer, the second dielectric layer, and the graphene layer are partially removed so as to define an area of an active region. Moreover, within the area of the active region, at least a portion of a stack layer of the electrode material layer, the second dielectric layer, and the graphene layer on the nanowire is retained.

Figure 10A:
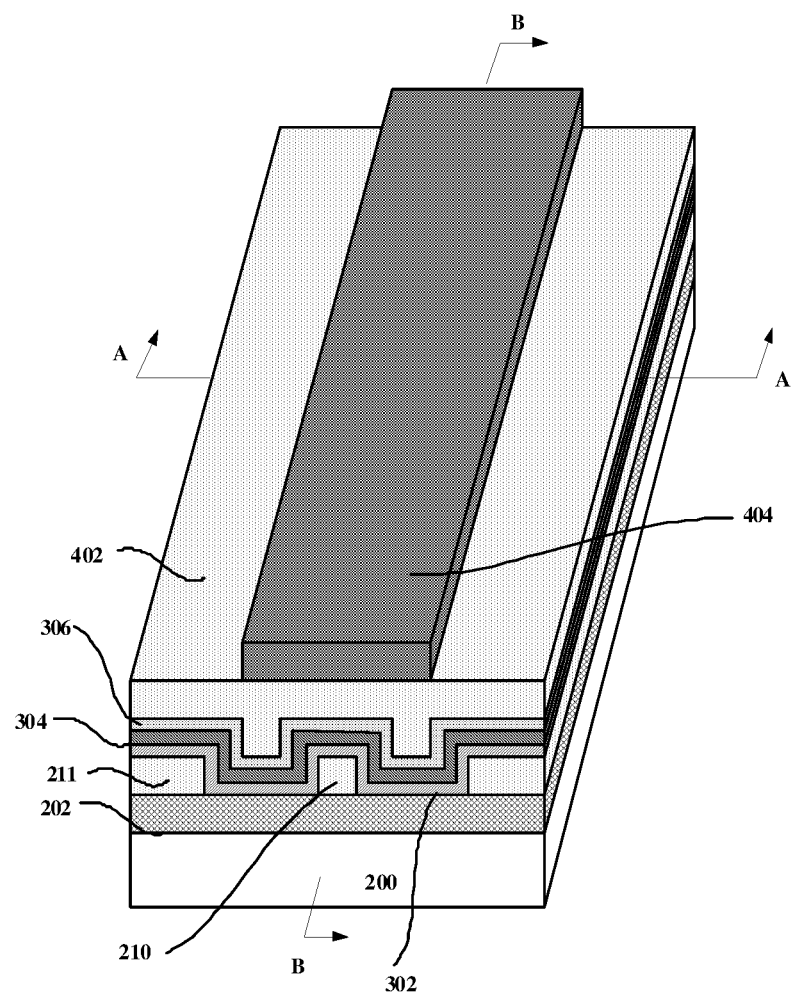
FIG. 10A is a perspective view of a structure at a phase of a manufacturing process of a semiconductor device.
Figure 10B:
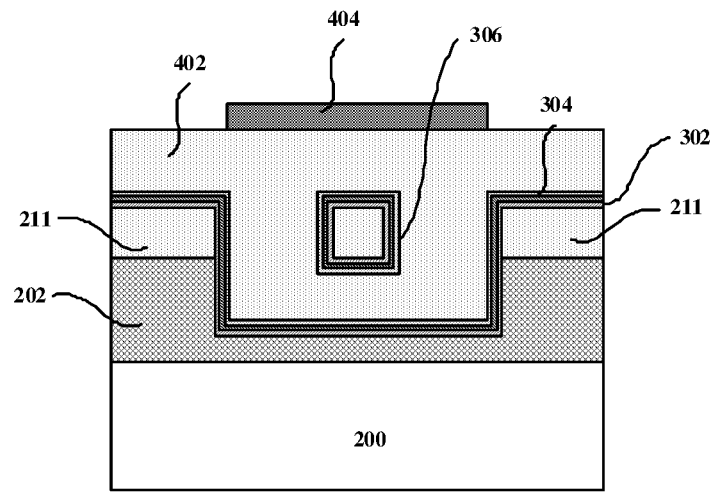
FIG. 10B schematically illustrates a cross-sectional diagram intercepted along a line A-A' in FIG. 10A.
Figure 10C:
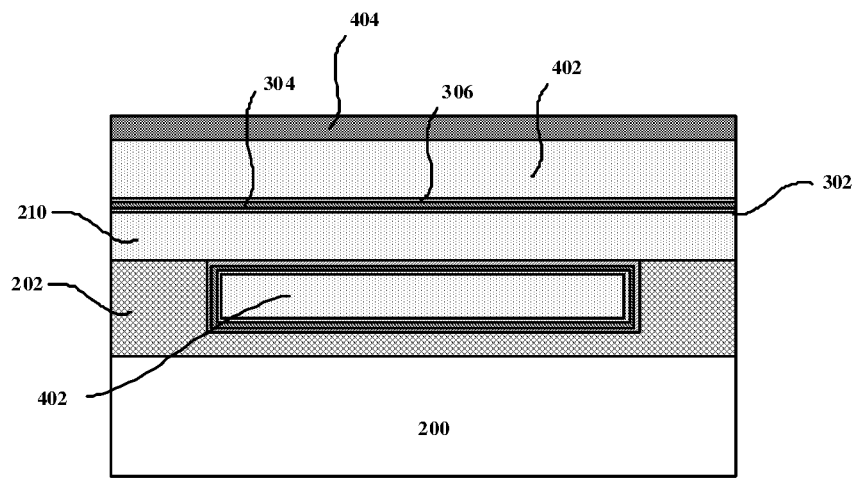
FIG. 10C schematically illustrates a cross-sectional diagram intercepted along a line B-B' in FIG. 10A.

FIG. 10A to FIG. 10C, FIG. 11A to FIG. 11C, and FIG. 12A to FIG. 12C show the active region defining processing according to an implementation of this disclosure. In this implementation, the step of performing the active region defining processing includes: forming a patterned mask 404 on the electrode material layer 402, as shown in FIG. 10A, FIG. 10B, and FIG. 10C. The patterned mask 404 may shield at least a portion of the nanowire 210. FIG. 10A is a perspective view of a structure in which the patterned mask 404 is formed on the electrode material layer 402 according to a form of the present disclosure. FIG. 10B schematically illustrates a cross-sectional diagram intercepted along a line A-A' in FIG. 10A. FIG. 10C schematically illustrates a cross-sectional diagram intercepted along a line B-B' in FIG. 10A. In this form, the patterned mask 404 shields the nanowire 210 and the recess 212, as shown in FIG. 10A, FIG. 10B, and FIG. 10C.

In another specific form, the patterned mask 404 may also merely shield the nanowire 210 and a portion of the recess 212 (not shown in the figures). For example, the mask 404 may be formed to have a narrower lateral width than the mask 404 shown in FIG. 10B.

Figure 11A:
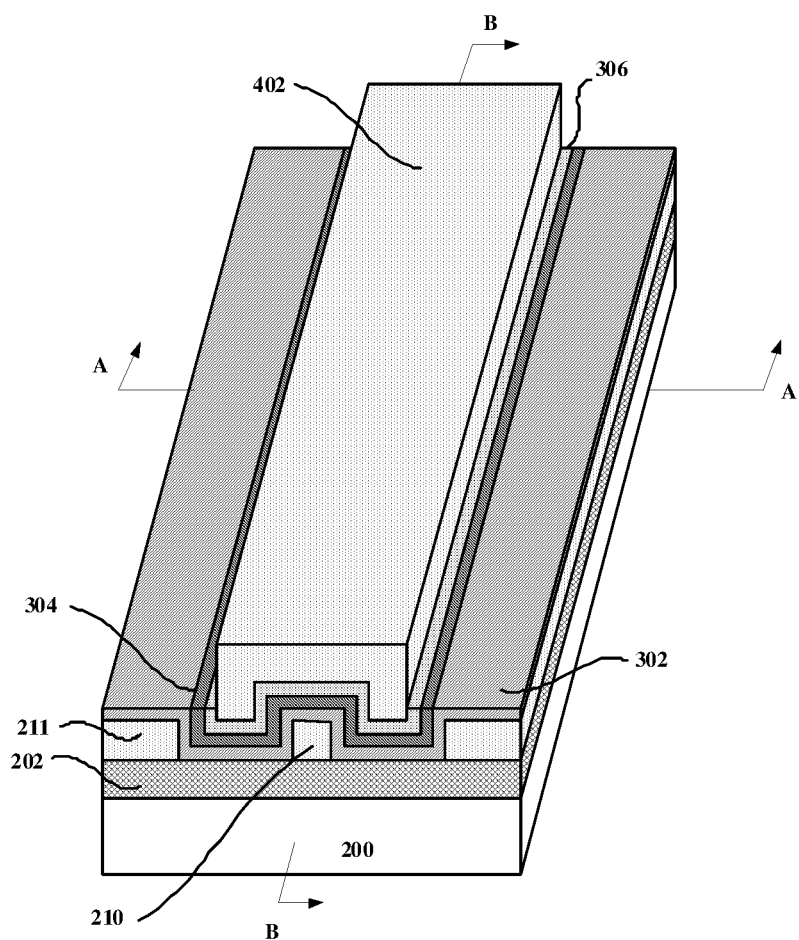
FIG. 11A is a perspective view of a structure at a phase of a manufacturing process of a semiconductor device.
Figure 11B:
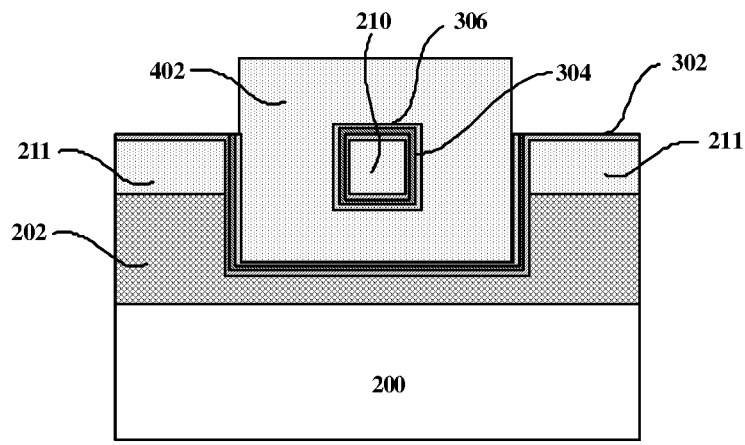
FIG. 11B schematically illustrates a cross-sectional diagram intercepted along a line A-A' in FIG. 11A.
Figure 11C:
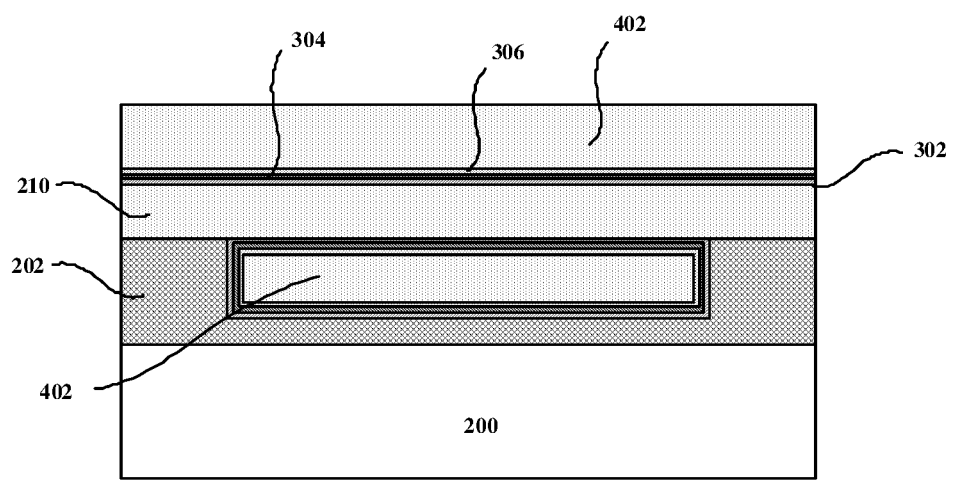
FIG. 11C schematically illustrates a cross-sectional diagram intercepted along a line B-B' in FIG. 11A.

Then, portions of the electrode material layer 402, the second dielectric layer 306, and the graphene layer 304 that are not shielded by the patterned mask 404 are removed by using the patterned mask 404. That is, portions of the electrode material layer 402, the second dielectric layer 306, and the graphene layer 304 (for example, the portions of the electrode material layer 402, the second dielectric layer 306, and the graphene layer 304 that are not shielded by the patterned mask 404) are removed. So that, the area of the active region is defined. Then the patterned mask 404 may be removed. Perspective view of the obtained structure is shown in FIG. 11A. FIG. 11B and FIG. 11C are sectional diagrams of FIG. 11A intercepted along a line A-A' and a line B-B', respectively. Within the area of the active region, at least a portion of a stack layer, on the nanowire 210, of the electrode material layer 402, the second dielectric layer 306, and the graphene layer 304 is retained.

In some forms, the stack layer of the electrode material layer 402, the second dielectric layer 306, and the graphene layer 304 that is in the recess 212 (or, on a surface of the recess 212) may be removed. However, in some other forms, the stack layer of the electrode material layer 402, the second dielectric layer 306, and the graphene layer 304 that is in the recess 212 (or, on a surface of the recess 212) may be retained.

In another implementation, the first material layer 204 may further include a support portion 216 at two ends of the recess 212 and above the first dielectric layer 202, as described in one of the implementations regarding step 101. In some forms, the patterned mask shields the nanowire 210, and further shields at least a portion of the first material layer 204 that is bonded or connected to the nanowire 210, for example, at least a portion of the support portion 216.

Figure 12A:
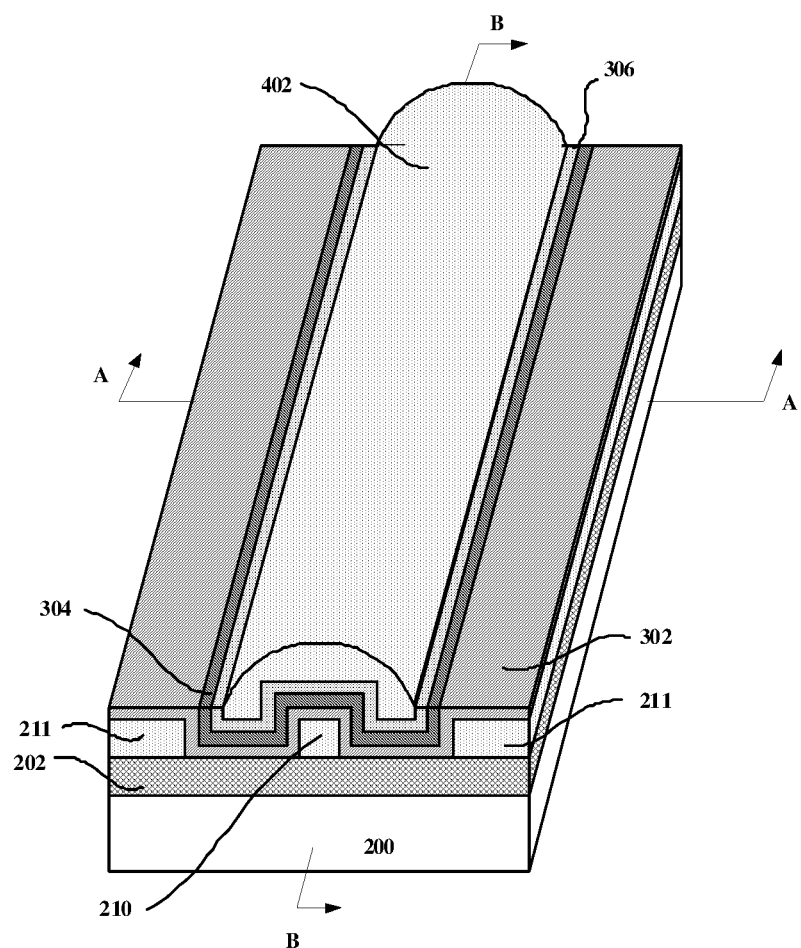
FIG. 12A is a perspective view of a structure at a phase of a manufacturing process of a semiconductor device.
Figure 12B:
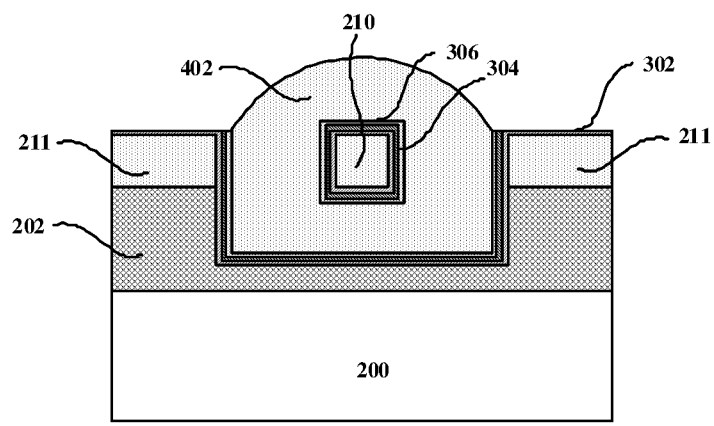
FIG. 12B schematically illustrates a cross-sectional diagram intercepted along a line A-A' in FIG. 12A.
Figure 12C:
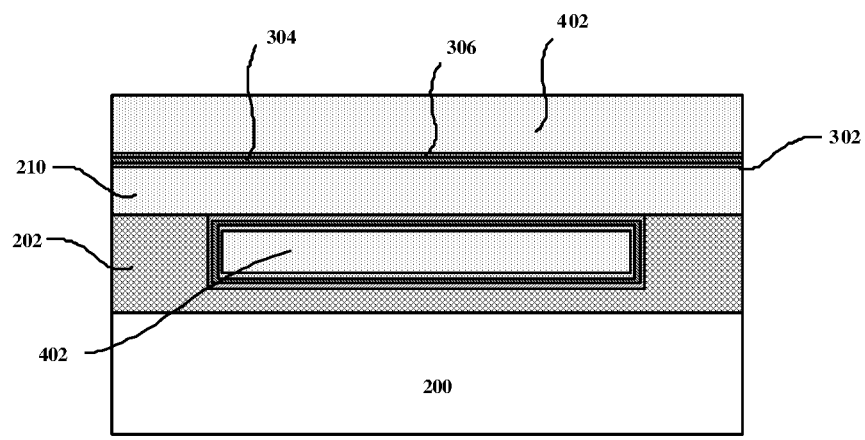
FIG. 12C schematically illustrates a cross-sectional diagram intercepted along a line B-B' in FIG. 12A.

Preferably, the active region defining processing may further include a shaping step, so as to process a profile of the electrode material layer 402, as shown in FIG. 12A to FIG. 12C. For example, through annealing, the profile of the electrode material layer 402 may be smoothened, and the recess 212 may be better filled. FIG. 12A shows a perspective view of a structure obtained after annealing processing is performed on the structure in FIG. 11A. FIG. 12B and FIG. 12C are cross-sectional diagrams of FIG. 12A intercepted along a line A-A' and a line B-B', respectively. As shown in figures, the profile of the electrode material layer 402 is smooth.

Subsequently, as shown in FIG. 1, in step 113, a gate defining processing is performed. The gate defining processing may include etching at least a portion of the stack layer to at least the second dielectric layer so as to form a gate structure surrounding an intermediate portion of the nanowire. The gate structure includes a portion of the electrode material layer and the second dielectric layer.

Figure 13A:
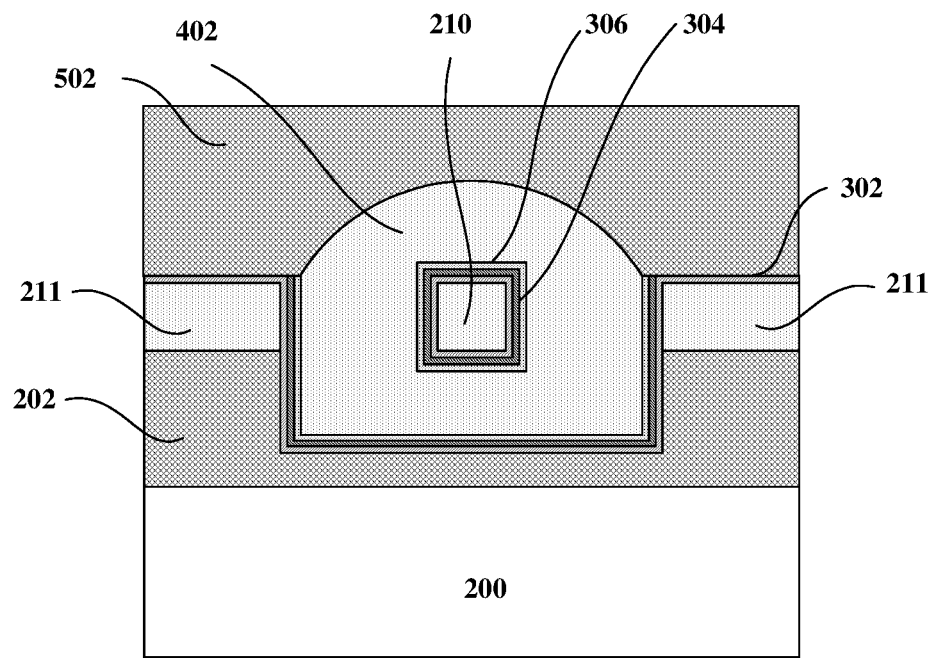
FIG. 13A and FIG. 13B are schematic diagrams that illustrate cross sections of a structure at a phase of a manufacturing process of a semiconductor device.
Figure 13B:
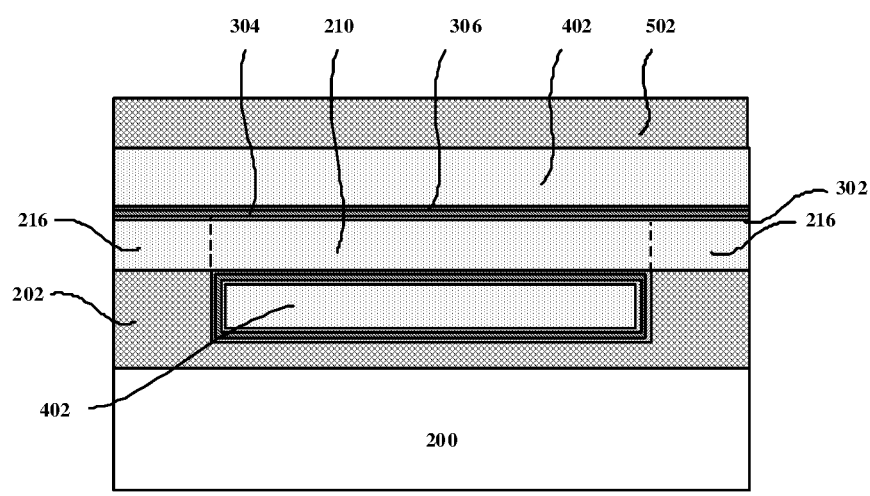

In an implementation, the step of performing the gate defining processing may include: forming a third dielectric layer 502 to cover at least the substrate structure and the area of the active region, as shown in FIG. 13A and FIG. 13B. FIG. 13A and FIG. 13B show sectional diagrams that are intercepted along a transverse direction of the nanowire 210 (the nanowire 210 is above the recess) (for example, a direction of the line A-A' shown in the foregoing figures) and intercepted along a longitudinal direction of the nanowire 210 (for example, a direction of the line B-B' shown in the foregoing figures), respectively. The material of the third dielectric layer may include an oxide of silicon.

Figure 14A:
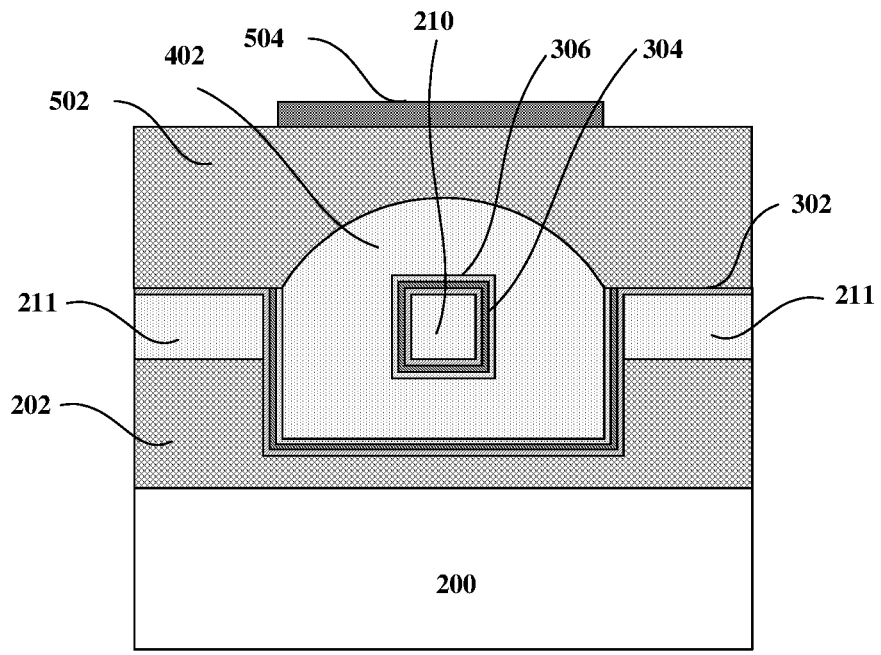
FIG. 14A and FIG. 14B are schematic diagrams that illustrate cross sections of a structure at a phase of a manufacturing process of a semiconductor device.
Figure 14B:
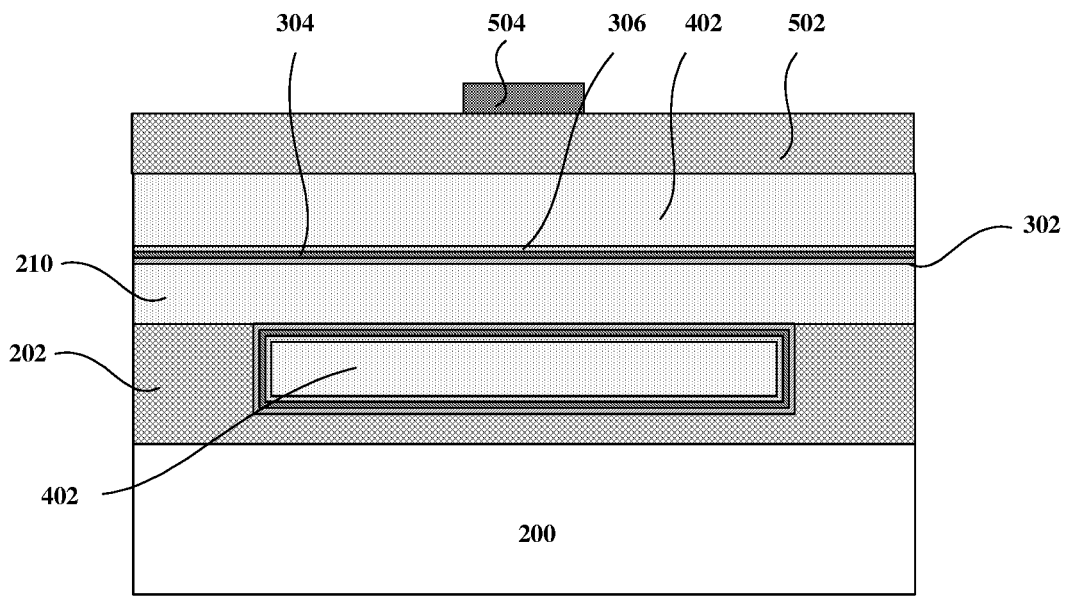
Figure 15A:
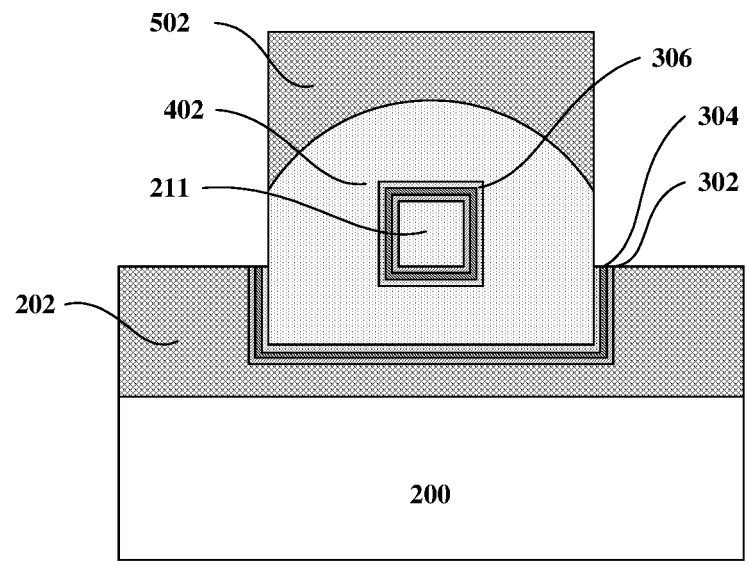
FIG. 15A and FIG. 15B are schematic diagrams that illustrate cross sections of a structure at a phase of a manufacturing process of a semiconductor device.
Figure 15B:
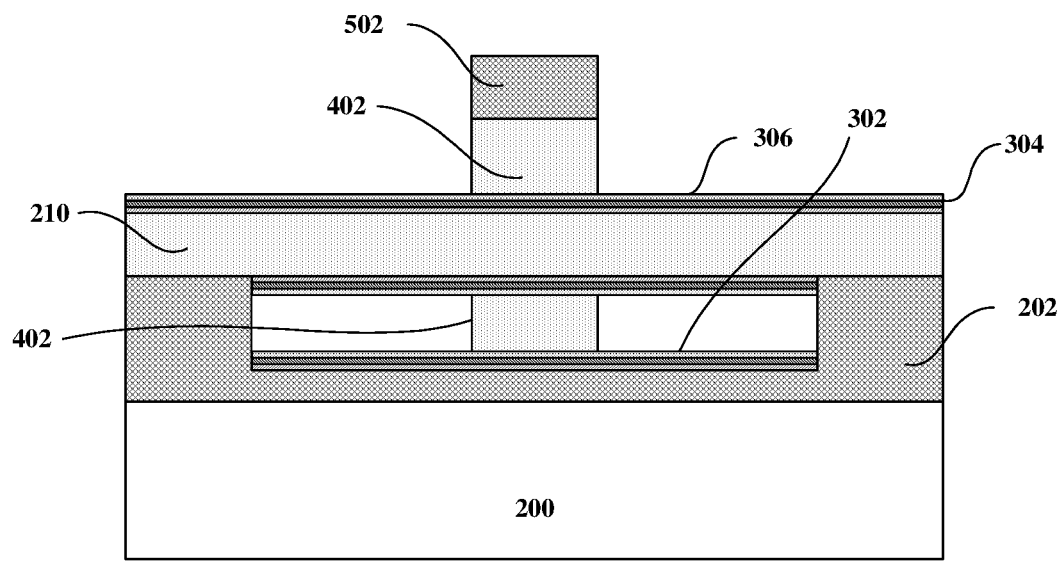

Subsequently, for example, as shown in FIG. 14A and FIG. 14B, the at least a portion of the stack layer of the electrode material layer, the second dielectric layer, and the graphene layer is etched to at least the second dielectric layer 306 by using a patterned mask 504. As such, a gate structure surrounding an intermediate portion of the nanowire 210 is formed. For example, the stack layer at a bottom portion of the recess 212 may be first etched by using dry etching, and then the electrode material layer 402 under a portion of the nanowire 210 that is in the recess 212 and is not shielded is etched, so that the gate structure is formed. The gate structure includes a portion of the electrode material layer and the second dielectric layer. In a form, during this etching, the stack layer on a side wall of the recess 212 is etched and removed, as shown in FIG. 15A and FIG. 15B. In another form, the stack layer at the bottom portion and the side wall of the recess 212 may also be removed in subsequent steps. In an implementation, the electrode material layer 402 is used as a first gate, and the nanowire 210 covered by the electrode material layer 402 is used as a second gate.

Figure 16A:
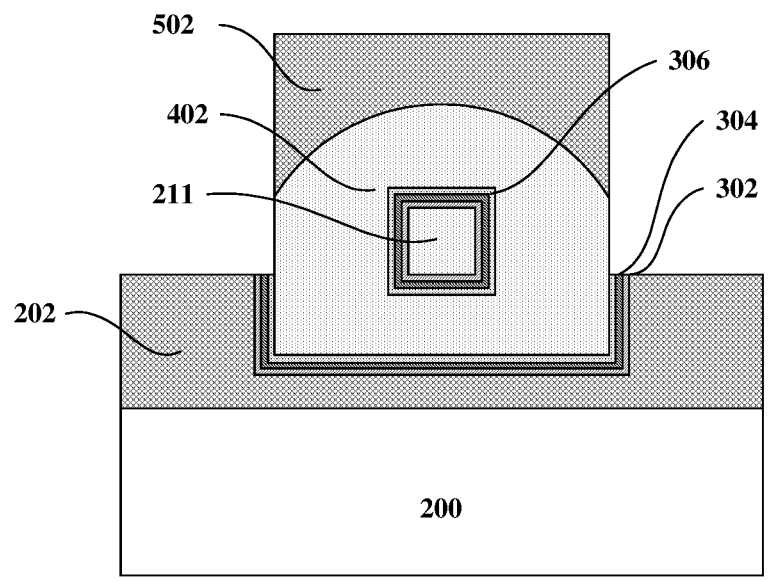
FIG. 16A and FIG. 16B are schematic diagrams that illustrate cross sections of a structure at a phase of a manufacturing process of a semiconductor device.
Figure 16B:
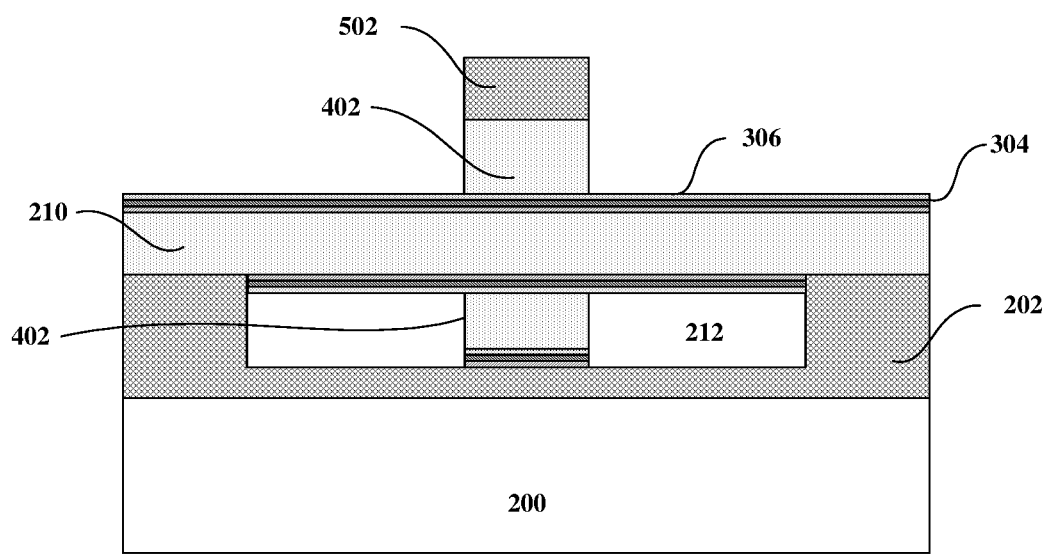

Optionally, the method may further include a step of removing the stack layer at the bottom portion and the side wall of the recess 212. For example, stack layer other than the bottom portion and the side wall of the recess 212 may be shielded by a patterned mask and the stack layer at the bottom portion and the side wall of the recess 212 may be removed using a dry etching process. Cross-sectional diagrams of the obtained structure are shown in FIG. 16A and FIG. 16B, respectively.

Figure 17:
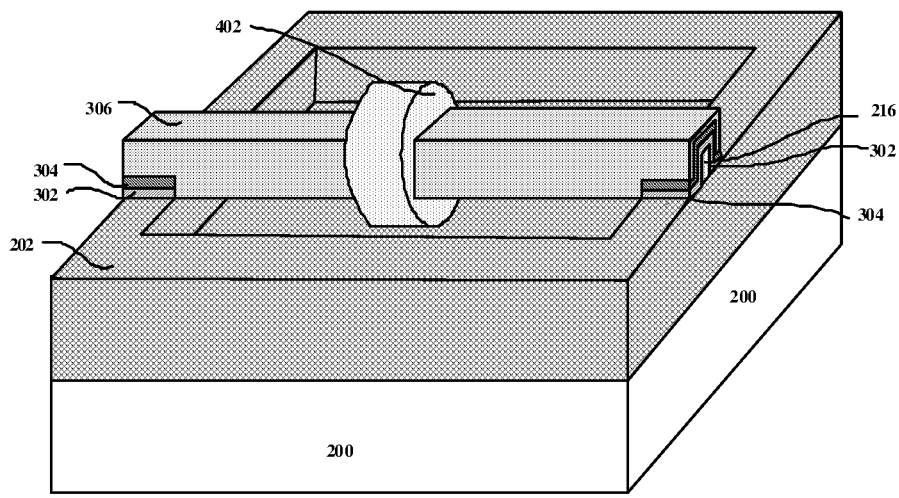
FIG. 17 is a perspective view of a structure at a phase of a manufacturing process of a semiconductor device.

Optionally, the method may further include a step of removing the third dielectric layer 502. Moreover, a bottom portion of the electrode material layer is shaped, and a cross sectional profile of the shaped electrode material layer 402 is circular, as shown in the perspective view of the obtained structure of FIG. 17.

Finally and optionally, as shown in FIG. 1, the method may further include step 115, which is a step of forming a contact component.

Figure 18A:
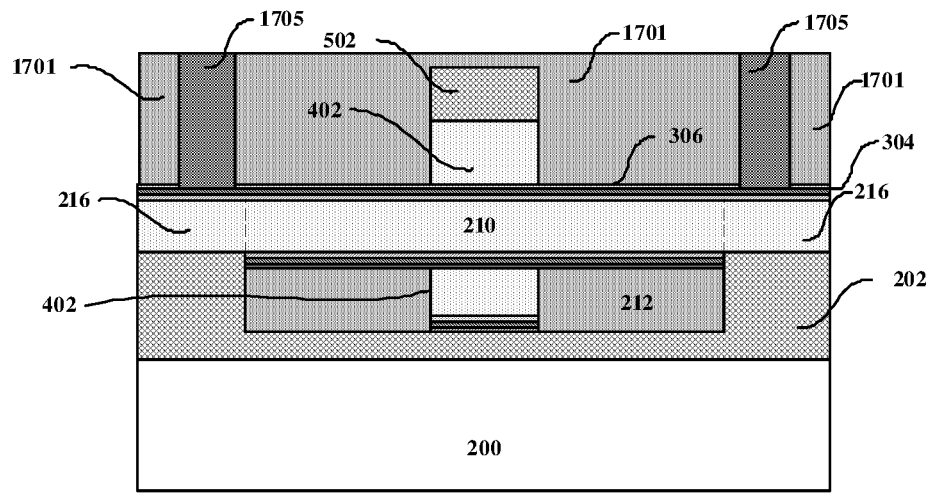
FIG. 18A and FIG. 18B are schematic diagrams that illustrate cross sections of a structure at a phase of a manufacturing process of a semiconductor device.

In an implementation, as shown in FIG. 18A, after the gate defining processing, a fourth dielectric layer 1701 may further be formed, so as to at least cover the substrate structure and the area of the active region. A material forming the fourth dielectric layer may include an oxide of silicon. Subsequently, a hole 1703 through the fourth dielectric layer and the second dielectric layer 306 to the graphene layer 304 is formed. The hole 1703 (not shown in the figures, filled with 1075) is separated from the gate structure. Then the hole is filled with a conductive material, so as to form a contact component 1705 to the graphene layer (i.e., may be an electrode contact component to a source/drain region).

FIG. 18A shows that the contact component 1705 is located at the support portion 216 which is at the two ends of the nanowire 210 and is bonded thereto. However, it should be understood that, according to the teachings of the present disclosure, a person skilled in the art may adjust the position of the contact component 1705 according to various requirements. For example, the contact component 1705 may be conceived to be located at the nanowire (the nanowire crosses above the recess).

Figure 18B:
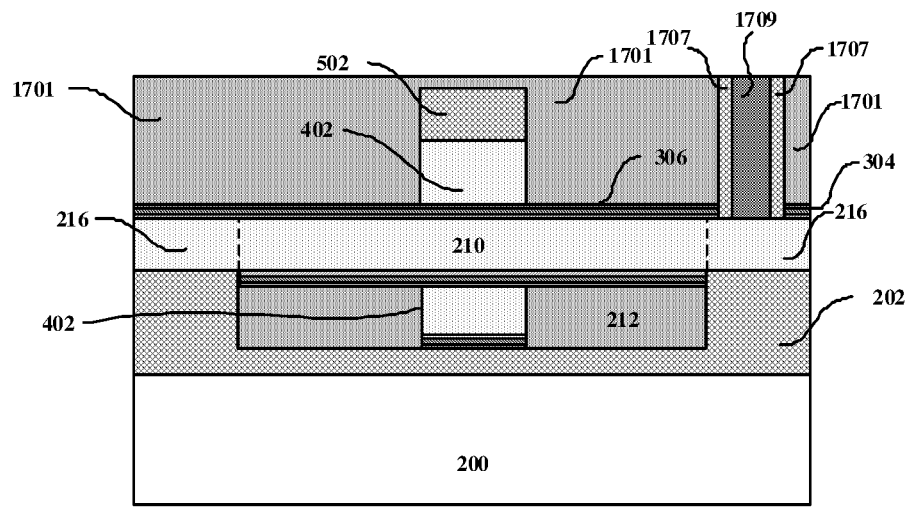

In an implementation, a doped nanowire 210 may be used as the second gate (or, a back gate), as stated above. For example, as shown in FIG. 18B, a fourth dielectric layer may be formed to at least cover the substrate structure and the area of the active region. A material forming the fourth dielectric layer may include an oxide of silicon. Subsequently, a hole running through the fourth dielectric layer, the second dielectric layer 306, and the graphene layer 304 to the first material layer 204 (the nanowire 210) is formed. Next, an insulating material layer 1707 is formed on a side wall of the hole. Then, after the insulating material layer 1707 is formed, the hole is filled with a conductive material so as to form a contact component 1709 to at least a portion of the first material layer 204. Subsequently, the hole is filled with a conductive material so as to form a contact component to the first material layer (i.e., a second gate contact component), as shown in FIG. 18B.

In another implementation stated above, when the two ends of the nanowire 210 are separately bonded or connected to a portion of the first material 204 that are at the two ends of the recess 212 and above the first dielectric layer 202, the step of forming the contact component (i.e., the second gate contact component) may include: forming a fourth dielectric layer, where the fourth dielectric layer at least covers the substrate structure and the area of the active region. A material forming the fourth dielectric layer may include an oxide of silicon. Next, a hole passing through the fourth dielectric layer, the second dielectric layer 306, and the graphene layer 304 to at least a portion of the first material layer 204 is formed. Then, an insulating material layer is formed on a side wall of the hole. Subsequently, after the insulating material layer is formed, the hole is filled with a conductive material so as to form a contact component to the at least a portion of the first material layer, where the insulating material layer electrically isolates the graphene layer from the contact component.

According to forms of the present disclosure, a new method for manufacturing a semiconductor device that introduces graphene is provided. By using features and a dual-gate structure of graphene, the operating current is better controlled and performances of a device are improved.

It should be understood that this disclosure further teaches a semiconductor device, including: a substrate structure, the substrate structure including a substrate and a first material layer on the substrate, a recess being formed in the substrate, the first material layer including a nanowire, and the nanowire spanning the recess and being suspended above the recess; a base layer on an exposed surface of the nanowire; a graphene layer on the base layer; a second dielectric layer on the graphene layer; and a gate structure surrounding an intermediate portion of the nanowire, where the gate structure includes a portion of the electrode material layer and the second dielectric layer.

In an implementation, the substrate includes a substrate layer and a first dielectric layer on the substrate layer, the first material layer being on the first dielectric layer, and the recess being formed in the first dielectric layer.

In an implementation, the recess further extends through the first dielectric layer into the substrate layer.

In an implementation, the gate structure further includes a portion in the recess below the nanowire.

In an implementation, the first material layer further includes a portion above the first dielectric layer at two ends of the recess, the two ends of the recess being bonded to the portion of the first material layer.

In an implementation, the first material layer is formed by polysilicon, or doped polysilicon or silicon germanium; the material of the base layer includes an oxide of aluminum; the material of the first dielectric layer includes an oxide of silicon; and the material of the second dielectric layer includes boron nitride, an oxide of silicon, an oxide of hafnium, an oxide of aluminum, or a nitride of aluminum.

In an implementation, the graphene layer is selectively grown on the base layer.

In an implementation, the nanowire is formed by doped polysilicon; and the portion of the electrode material layer that is included in the gate structure is used as a first gate, and the nanowire is used as a second gate.

In an implementation, the device further includes: a second base layer on an exposed surface of the recess; a second graphene layer on the base layer; and a second dielectric layer on the second graphene layer, where the base layer is integrally formed with the second base layer, the graphene layer is integrally formed with the second graphene layer, and the second dielectric layer is integrally formed with the second dielectric layer.

In an implementation, the device further includes: a fourth dielectric layer, at least covering the substrate structure and the nanowire on which a stack layer of the base layer, the graphene layer, and the second dielectric layer is formed; a hole running through the fourth dielectric layer and the second dielectric layer to the graphene layer; and a contact component filling the hole and to the graphene layer.

In an implementation, the device further includes: a fourth dielectric layer, at least covering the substrate structure and the nanowire on which a stack layer of the base layer, the graphene layer, and the second dielectric layer is formed; a hole running through the fourth dielectric layer, the second dielectric layer, and the graphene layer to the first material layer; an insulating material layer on a side wall of the hole; and a contact component filling the hole and to the first material layer, where the insulating material layer electrically isolates the graphene layer from the contact component.

In an implementation, the device further includes: a fourth dielectric layer, at least covering the substrate structure and the nanowire on which a stack layer of the base layer, the graphene layer, and the second dielectric layer is formed; a hole running through the fourth dielectric layer, the second dielectric layer, and the graphene layer to the portion of the first material layer; and a contact component which is formed to the at least a portion of the first material layer by filling the hole with a conductive material.

A semiconductor device and a manufacturing method therefor according to the forms of this disclosure are described in detail above. To avoid obscuring the teaching of this disclosure, some details generally known in this field are not described; and according to the description above, a person skilled in the art would completely understand how to implement a technical solution disclosed herein. In addition, this specification discloses that the forms taught may be combined freely. A person skilled in the art should understand that various variations may be made to the forms described above without departing from the spirit and scope of this disclosure that are defined by the claims.

What is claimed is:

1. A semiconductor device, comprising:
a substrate structure comprising a substrate and a first material layer on the substrate, and a recess formed in the substrate, wherein the first material layer comprises a support portion above an edge of an end of the recess and a nanowire spanning and suspended above the recess, the support portion extends along a width direction of the nanowire such that the support portion is wider than the nanowire;
a base layer surrounding an exposed surface of the nanowire;
a graphene layer surrounding the base layer;
a second dielectric layer surrounding the graphene layer; and
a gate structure surrounding an intermediate portion of the nanowire, wherein the gate structure comprises a portion of the second dielectric layer and an electrode material layer surrounding the portion of the second dielectric layer.

2. The device according to claim 1, wherein:
the substrate comprises a substrate layer and a first dielectric layer on the substrate layer;
the first material layer is on the first dielectric layer; and
the recess is formed in the first dielectric layer.

3. The device according to claim 2, wherein the recess further extends through the first dielectric layer into the substrate layer.

4. The device according to claim 1, wherein the gate structure further comprises a portion in the recess below the nanowire.

5. The device according to claim 2, wherein
the first material layer further comprises a portion above the first dielectric layer at two ends of the recess bonded to the portion of the first material layer forming the nanowire.

6. The device according to claim 5, further comprising:
a fourth dielectric layer, covering at least the substrate structure and the nanowire on which a stack layer of the base layer, the graphene layer, and the second dielectric layer is formed;
a hole through the fourth dielectric layer, the second dielectric layer, and the graphene layer to the portion of the first material layer; and
a contact component to the at least a portion of the first material layer by filling the hole with a conductive material.

7. The device according to claim 2, wherein:
the first material layer comprises polysilicon, doped polysilicon, or silicon germanium;
the base layer comprises an oxide of aluminum;
the first dielectric layer comprises an oxide of silicon; and
the second dielectric layer comprises boron nitride, an oxide of silicon, an oxide of hafnium, an oxide of aluminum, or a nitride of aluminum.

8. The device according to claim 1, wherein the graphene layer is selectively grown on the base layer.

9. The device according to claim 1, wherein:
the nanowire comprises doped polysilicon; and
the portion of the electrode material layer in the gate structure is used as a first gate, and the nanowire is used as a second gate.

10. The device according to claim 1, further comprising:
a second base layer on an exposed surface of the recess;
a second graphene layer on the second base layer; and
a third dielectric layer on the second graphene layer,
wherein the base layer is integrally formed with the second base layer, the graphene layer is integrally formed with the second graphene layer, and the third dielectric layer is integrally formed with the second dielectric layer.

11. The device according to claim 1, further comprising:
a fourth dielectric layer, covering at least the substrate structure and the nanowire on which a stack layer of the base layer, the graphene layer, and the second dielectric layer is formed;
a hole through the fourth dielectric layer and the second dielectric layer to the graphene layer; and
a contact component filling the hole and to the graphene layer.

12. The device according to claim 1, further comprising:
a fourth dielectric layer, covering at least the substrate structure and the nanowire on which a stack layer of the base layer, the graphene layer, and the second dielectric layer is formed;
a hole through the fourth dielectric layer, the second dielectric layer, and the graphene layer to the first material layer;
an insulating material layer on a side wall of the hole; and
a contact component filling the hole and to the first material layer,
wherein the insulating material layer electrically isolates the graphene layer from the contact component.

* * * * *